（12) United States Patent
Seo et al.

(10) Patent No.: US 9,450,032 B2
(45) Date of Patent: Sep. 20, 2016

(54) LIGHT-EMITTING DEVICE, ELECTRONIC DEVICE, AND LIGHTING DEVICE

(71) Applicant: Semiconductor Energy Laboratory Co., Ltd., Kanagawa-ken (JP)

(72) Inventors: Satoshi Seo, Kanagawa (JP); Nobuharu Ohsawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/694,165

(22) Filed: Apr. 23, 2015

(65) Prior Publication Data

US 2015/0311250 A1 Oct. 29, 2015

(30) Foreign Application Priority Data

Apr. 25, 2014 (JP) ................................. 2014-091459

(51) Int. Cl.
| | |
|---|---|
| *H01L 29/20* | (2006.01) |
| *H01L 33/00* | (2010.01) |
| *H01L 27/32* | (2006.01) |
| *H01L 51/50* | (2006.01) |
| *H01L 51/52* | (2006.01) |

(52) U.S. Cl.
CPC ......... *H01L 27/322* (2013.01); *H01L 27/3211* (2013.01); *H01L 51/5012* (2013.01); *H01L 51/5265* (2013.01)

(58) Field of Classification Search
USPC ........................... 257/89, 81, 88; 438/28, 66
See application file for complete search history.

(56) References Cited

U.S. PATENT DOCUMENTS

| | | | |
|---|---|---|---|
| 6,281,634 B1 | 8/2001 | Yokoyama | |
| 6,429,599 B1 | 8/2002 | Yokoyama | |
| 6,433,486 B1 | 8/2002 | Yokoyama | |
| 6,690,118 B2 | 2/2004 | Yokoyama | |
| 6,995,517 B2 | 2/2006 | Yokoyama | |
| 7,315,131 B2 | 1/2008 | Yokoyama | |
| 7,339,559 B2 | 3/2008 | Yokoyama | |
| 7,741,770 B2 | 6/2010 | Cok et al. | |
| 2007/0035243 A1 | 2/2007 | Lee | |
| 2009/0121239 A1* | 5/2009 | Asaki | ................. H01L 51/5265 257/89 |
| 2010/0231484 A1 | 9/2010 | Cok et al. | |
| 2013/0264549 A1 | 10/2013 | Yamazaki et al. | |
| 2013/0265320 A1 | 10/2013 | Yamazaki et al. | |

(Continued)

FOREIGN PATENT DOCUMENTS

| | | |
|---|---|---|
| JP | 2004-006362 A | 1/2004 |
| JP | 2007-053090 A | 3/2007 |
| JP | 2010-541180 | 12/2010 |

*Primary Examiner* — Errol Fernandes
(74) *Attorney, Agent, or Firm* — Husch Blackwell LLP

(57) ABSTRACT

A novel light-emitting device with small power consumption, which can be formed with high productivity, is provided. The light-emitting device includes a first pixel, a second pixel, and a third pixel. The first pixel includes a first light-emitting element and a first optical element, the second pixel includes a second light-emitting element and a second optical element, and the third pixel includes a third light-emitting element. A first light-emitting layer or a second light-emitting layer is shared among the first to third light-emitting elements. Furthermore, the first light-emitting layer includes a first light-emitting material having a spectrum peak in the range of higher than or equal to 540 nm and lower than or equal to 580 nm, and the second light-emitting layer includes a second light-emitting material having a spectrum peak in the range of higher than or equal to 420 nm and lower than or equal to 480 nm.

20 Claims, 19 Drawing Sheets

(56) References Cited

U.S. PATENT DOCUMENTS

| | | |
|---|---|---|
| 2014/0117339 A1 | 5/2014 | Seo |
| 2014/0134771 A1 | 5/2014 | Noda et al. |
| 2014/0225102 A1 | 8/2014 | Ikeda et al. |
| 2014/0252383 A1* | 9/2014 | Senda et al. .......... H01L 51/504 257/40 |
| 2014/0284575 A1 | 9/2014 | Sugisawa et al. |
| 2014/0284576 A1 | 9/2014 | Sugisawa et al. |
| 2014/0306201 A1* | 10/2014 | Yamazaki et al. .. H01L 51/5044 257/88 |
| 2015/0255520 A1 | 9/2015 | Seo et al. |
| 2015/0263076 A1 | 9/2015 | Seo et al. |

* cited by examiner

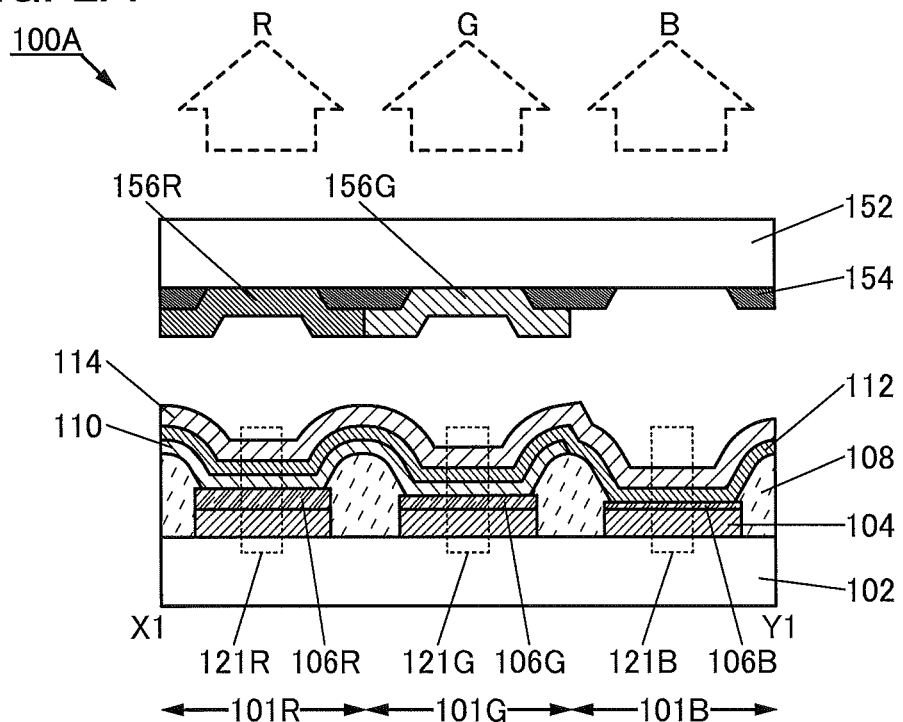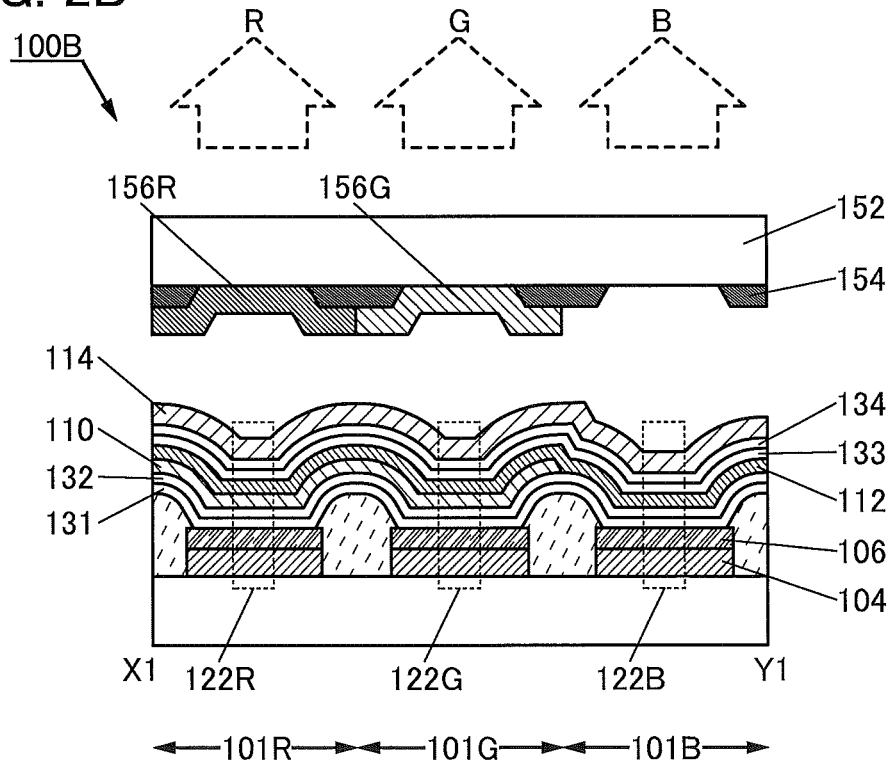

FIG. 17A
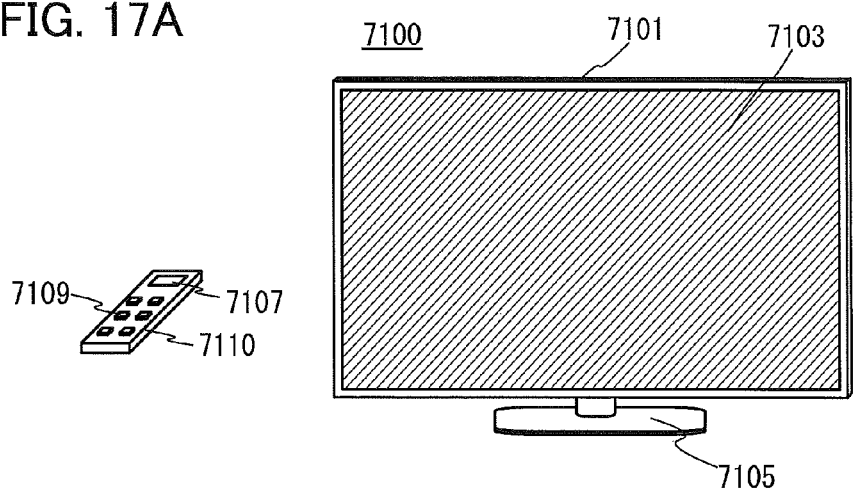
FIG. 17B
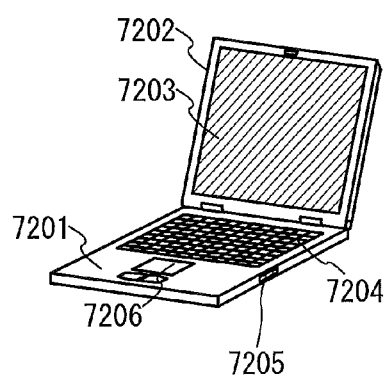
FIG. 17C
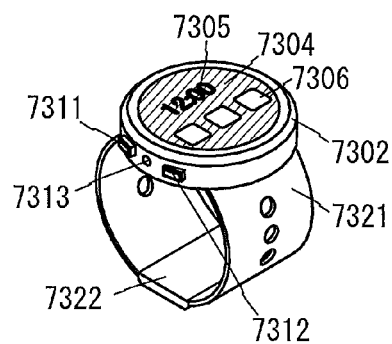
FIG. 17D
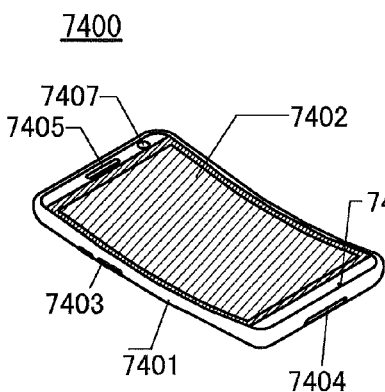
FIG. 17D'1  FIG. 17D'2
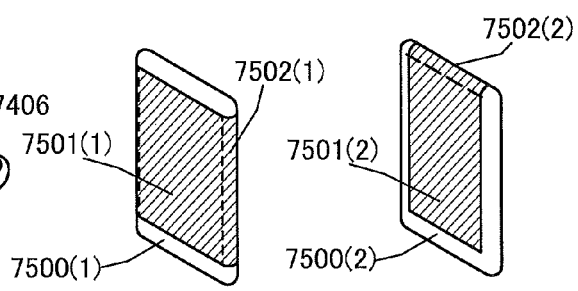

LIGHT-EMITTING DEVICE, ELECTRONIC DEVICE, AND LIGHTING DEVICE

BACKGROUND OF THE INVENTION

1. Field of the Invention

One embodiment of the present invention relates to a light-emitting device, an electronic device, and a lighting device which include a light-emitting element in which a light-emitting layer capable of emitting light by application of an electric field is provided between a pair of electrodes.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

2. Description of the Related Art

Light-emitting elements which include organic compounds as light-emitting layers and are characterized by thinness, lightweight, fast response, and direct current driving with low voltage are expected to be applied to next-generation flat panel displays. In particular, a light-emitting device in which light-emitting elements (e.g., organic EL elements) are arranged in a matrix is considered to have advantages of a wide viewing angle and excellent visibility over conventional liquid crystal display devices.

In an organic EL element, voltage application between electrodes, between which a light-emitting layer is interposed, causes recombination of electrons and holes injected from the electrodes, which brings a light-emitting substance (an organic compound) into an excited state, and the return from the excited state to the ground state is accompanied by light emission. Since the spectrum of light emitted from a light-emitting substance is peculiar to the light-emitting substance, use of different types of organic compounds as light-emitting substances makes it possible to provide light-emitting elements which exhibit light of various colors.

In the case of light-emitting devices for displaying images, at least three-color light, i.e., red, green and blue light, is necessary for reproduction of full-color images. Furthermore, to enhance image quality with favorable color reproducibility, various efforts such as use of a microcavity structure and a color filter have been made to improve color purity.

As a way to achieve full-color display, for example, there is a method in which light-emitting layers for different colors are deposited in pixels side by side. The light-emitting layers are vapor-deposited on only predetermined pixels using a shadow mask. In this case, to reduce cost by reducing the number of steps, a structure in which layers except the light-emitting layers, e.g., a hole-transport layer, an electron-transport layer, and a cathode, are formed to be shared among a plurality of pixels, is disclosed (for example, see Patent Document 1).

REFERENCE

Patent Document

[Patent Document 1] Japanese Published Patent Application No. 2004-006362

SUMMARY OF THE INVENTION

In the structure disclosed in Patent Document 1, light-emitting layers for different colors need to be deposited side by side, so that openings of a shadow mask need to be arranged (aligned) at predetermined positions with high accuracy. For higher definition of the light-emitting device, higher alignment accuracy is required. Thus, a problem of a reduction in yield in manufacturing a light-emitting device arises.

In the case where full-color display is attained by using white-light-emitting elements and color filters or color conversion layers overlapping with the light-emitting elements, energy loss due to the color filters or color conversion layers is caused. If driving is performed with higher current density of the light-emitting elements in order to compensate the energy loss, power consumption is increased or the reliability of the light-emitting elements is decreased.

In view of the above problems, an object of one embodiment of the present invention is to provide a novel light-emitting device. Another object is to provide a novel light-emitting device with high productivity and low power consumption. Another object is to provide a novel method for manufacturing a light-emitting device.

Note that the description of the above objects does not disturb the existence of other objects. In one embodiment of the present invention, there is no need to achieve all of these objects. Other objects are apparent from and can be derived from the description of the specification and the like.

One embodiment of the present invention is a light-emitting device including a first pixel, a second pixel, and a third pixel. The first pixel includes a first light-emitting element and a first optical element, the second pixel includes a second light-emitting element and a second optical element, and the third pixel includes a third light-emitting element. A first light-emitting layer or a second light-emitting layer is shared among the first to third light-emitting elements. Furthermore, the first light-emitting layer includes a first light-emitting material having a spectrum peak in the range of higher than or equal to 540 nm and lower than or equal to 580 nm, and the second light-emitting layer includes a second light-emitting material having a spectrum peak in the range of higher than or equal to 420 nm and lower than or equal to 480 nm More details are described below.

One embodiment of the present invention is a light-emitting device emitting a plurality of lights, which includes a first pixel capable of emitting light of a first color, a second pixel capable of emitting light of a second color, and a third pixel capable of emitting light of a third color. In the light-emitting device, the first pixel includes a first light-emitting element and a first optical element, and the first light-emitting element and the first optical element overlap with each other. The second pixel includes a second light-emitting element and a second optical element, and the second light-emitting element and the second optical element overlap with each other. The third pixel includes a third light-emitting element. The first light-emitting element includes a first electrode, a first light-emitting layer over the first electrode, a second light-emitting layer over the first light-emitting layer, and a second electrode over the second light-emitting layer. The second light-emitting element includes a third electrode, the first light-emitting layer over the third electrode, the second light-emitting layer over the first light-emitting layer, and the second electrode over the second light-emitting layer. The third light-emitting element includes a fourth electrode, the second light-emitting layer over the fourth electrode, and the second electrode over the second light-emitting layer. The first light-emitting layer includes a first light-emitting material having a spectrum peak in a range of higher than or equal to 540 nm and lower than or equal to 580 nm. The second light-emitting layer includes a second light-emitting material having a spectrum peak in a range of higher than or equal to 420 nm and lower than or equal to 480 nm.

One embodiment of the present invention is a light-emitting device emitting a plurality of lights, which includes a first pixel capable of emitting light of a first color, a second pixel capable of emitting light of a second color, and a third pixel capable of emitting light of a third color. In the light-emitting device, the first pixel includes a first light-emitting element and a first optical element, and the first light-emitting element and the first optical element overlap with each other. The second pixel includes a second light-emitting element and a second optical element, and the second light-emitting element and the second optical element overlap with each other. The third pixel includes a third light-emitting element. The first light-emitting element includes a first electrode, a first transparent conductive film over the first electrode, a first light-emitting layer over the first transparent conductive film, a second light-emitting layer over the first light-emitting layer, and a second electrode over the second light-emitting layer. The second light-emitting element includes a third electrode, a second transparent conductive film over the third electrode, the first light-emitting layer over the second transparent conductive film, the second light-emitting layer over the first light-emitting layer, and the second electrode over the second light-emitting layer. The third light-emitting element includes a fourth electrode, a third transparent conductive film over the fourth electrode, the second light-emitting layer over the third transparent conductive film, and the second electrode over the second light-emitting layer. The first light-emitting layer includes a first light-emitting material having a spectrum peak in a range of higher than or equal to 540 nm and lower than or equal to 580 nm. The second light-emitting layer includes a second light-emitting material having a spectrum peak in a range of higher than or equal to 420 nm and lower than or equal to 480 nm.

In the above-described structure, it is preferable that the first transparent conductive film include a first region having a first thickness, the second transparent conductive film include a second region having a second thickness, the third transparent conductive film include a third region having a third thickness, the first thickness be larger than the second thickness, and the second thickness be larger than the third thickness.

One embodiment of the present invention is a light-emitting device emitting a plurality of lights, which includes a first pixel capable of emitting light of a first color, a second pixel capable of emitting light of a second color, a third pixel capable of emitting light of a third color, and a fourth pixel capable of emitting light of a fourth color. In the light-emitting device, the first pixel includes a first light-emitting element and a first optical element, and the first light-emitting element and the first optical element overlap with each other. The second pixel includes a second light-emitting element and a second optical element, and the second light-emitting element and the second optical element overlap with each other. The third pixel includes a third light-emitting element. The fourth pixel includes a fourth light-emitting element. The first light-emitting element includes a first electrode, a first light-emitting layer over the first electrode, a second light-emitting layer over the first light-emitting layer, and a second electrode over the second light-emitting layer. The second light-emitting element includes a third electrode, the first light-emitting layer over the third electrode, the second light-emitting layer over the first light-emitting layer, and the second electrode over the second light-emitting layer. The third light-emitting element includes a fourth electrode, the second light-emitting layer over the fourth electrode, and the second electrode over the second light-emitting layer. The fourth light-emitting element includes a fifth electrode, the first light-emitting layer over the fifth electrode, the second light-emitting layer over the first light-emitting layer, and the second electrode over the second light-emitting layer. The first light-emitting layer includes a first light-emitting material having a spectrum peak in a range of higher than or equal to 540 nm and lower than or equal to 580 nm. The second light-emitting layer includes a second light-emitting material having a spectrum peak in a range of higher than or equal to 420 nm and lower than or equal to 480 nm.

One embodiment of the present invention is a light-emitting device emitting a plurality of lights, which includes a first pixel capable of emitting light of a first color, a second pixel capable of emitting light of a second color, a third pixel capable of emitting light of a third color, and a fourth pixel capable of emitting light of a fourth color. In the light-emitting device, the first pixel includes a first light-emitting element and a first optical element, and the first light-emitting element and the first optical element overlap with each other. The second pixel includes a second light-emitting element and a second optical element, and the second light-emitting element and the second optical element overlap with each other. The third pixel includes a third light-emitting element. The fourth pixel includes a fourth light-emitting element. The first light-emitting element includes a first electrode, a first transparent conductive film over the first electrode, a first light-emitting layer over the first transparent conductive film, a second light-emitting layer over the first light-emitting layer, and a second electrode over the second light-emitting layer. The second light-emitting element includes a third electrode, a second transparent conductive film over the third electrode, the first light-emitting layer over the second transparent conductive film, the second light-emitting layer over the first light-emitting layer, and the second electrode over the second light-emitting layer. The third light-emitting element includes a fourth electrode, a third transparent conductive film over the fourth electrode, the second light-emitting layer over the third transparent conductive film, and the second electrode over the second light-emitting layer. The fourth light-emitting element includes a fifth electrode, a fourth transparent conductive film over the fifth electrode, the second light-emitting layer over the fourth transparent conductive film, and the second electrode over the second light-emitting layer. The first light-emitting layer includes a first light-emitting material having a spectrum peak in a range of higher than or equal to 540 nm and lower than or equal to 580 nm. The second light-emitting layer includes a second light-emitting material having a spectrum peak in a range of higher than or equal to 420 nm and lower than or equal to 480 nm.

In the above-described structure, it is preferable that the first transparent conductive film include a first region having a first thickness, the second transparent conductive film include a second region having a second thickness, the third transparent conductive film include a third region having a third thickness, the fourth transparent conductive film include a fourth region having a fourth thickness, the first thickness be larger than the fourth thickness, the fourth thickness be larger than the second thickness, and the second thickness be larger than the third thickness.

One embodiment of the present invention is a light-emitting device emitting a plurality of lights, which includes a first pixel capable of emitting light of a first color, a second pixel capable of emitting light of a second color, a third pixel capable of emitting light of a third color, and a fourth pixel capable of emitting light of a fourth color. In the light-emitting device, the first pixel includes a first light-emitting element and a first optical element, and the first light-emitting element and the first optical element overlap with each other. The second pixel includes a second light-emitting element and a second optical element, and the second light-emitting element and the second optical element overlap with each other. The third pixel includes a third light-emitting element. The fourth pixel includes a fourth light-emitting element. The first light-emitting element includes a first electrode, a first light-emitting layer over the first electrode, and a second electrode over the second light-emitting layer. The second light-emitting element includes a third electrode, the first light-emitting layer over the third electrode, and the second electrode over the second light-emitting layer. The third light-emitting element includes a fourth electrode, the second light-emitting layer over the fourth electrode, the first light-emitting layer over the second light-emitting layer, and the second electrode over the first light-emitting layer. The fourth light-emitting element includes a fifth electrode, the first light-emitting layer over the fifth electrode, and the second electrode over the second light-emitting layer. The first light-emitting layer includes a first light-emitting material having a spectrum peak in a range of higher than or equal to 540 nm and lower than or equal to 580 nm. The second light-emitting layer includes a second light-emitting material having a spectrum peak in a range of higher than or equal to 420 nm and lower than or equal to 480 nm.

Note that the first light-emitting material preferably emits yellowish green light, yellow light, or orange light. The second light-emitting material preferably emits purple light, blue light, or blue-green light. The stacking order of the first light-emitting layer and the second light-emitting layer may be interchanged as appropriate.

One embodiment of the present invention includes, in its scope, an electronic device including the light-emitting device with the above-described structure and having a touch sensor function or a lighting device including the light-emitting device with the above-described structure and having a touch sensor function. Note that a light-emitting device in this specification means an image display device or a light source (including a lighting device). In addition, the light-emitting device includes, in its category, all of the following: a module in which a light-emitting device is connected to a connector such as a flexible printed circuit (FPC) or a tape carrier package (TCP), a module in which a printed wiring board is provided on the tip of a TCP, and a module in which an integrated circuit (IC) is directly mounted on a light-emitting element by a chip on glass (COG) method.

With one embodiment of the present invention, a novel light-emitting device can be provided. With one embodiment of the present invention, a novel light-emitting device with high productivity and low power consumption can be provided. With one embodiment of the present invention, a novel method for manufacturing a light-emitting device can be provided.

Note that the description of these effects does not disturb the existence of other effects. One embodiment of the present invention does not necessarily have all of these effects. Other effects are apparent from and can be derived from the description of the specification, the drawings, the claims, and the like.

BRIEF DESCRIPTION OF THE DRAWINGS

In the accompanying drawings:

FIGS. 2A and 2B are each a cross-sectional view of a light-emitting device of one embodiment of the present invention;

FIGS. 17A, 17B, 17C, 17D, 17D'-1, and 17D'-2 each illustrate an electronic device;

DETAILED DESCRIPTION OF THE INVENTION

Figure 1A:
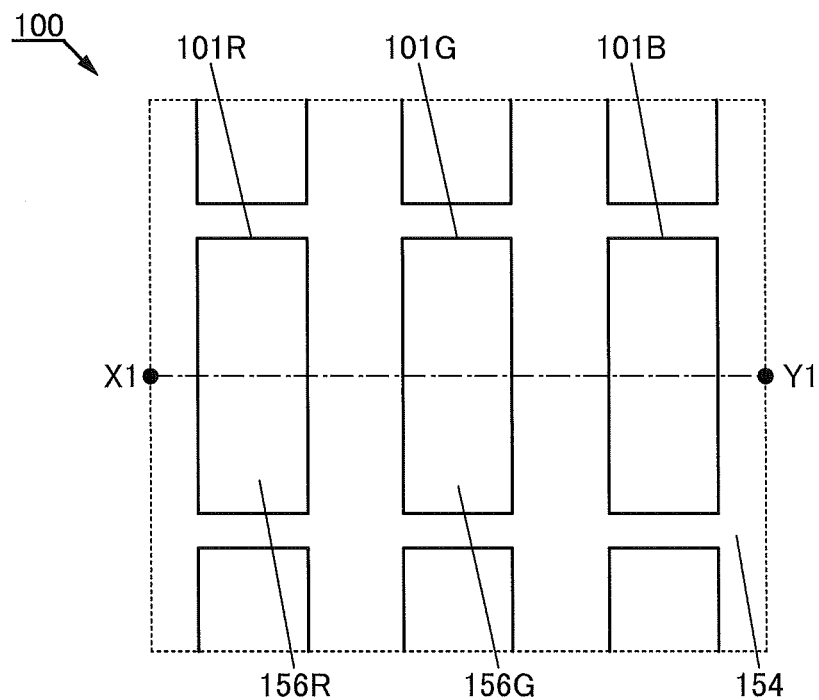
FIGS. 1A and 1B are a plan view and a cross-sectional view, respectively, of a light-emitting device of one embodiment of the present invention.

Embodiments of the present invention will be described below with reference to the drawings. However, the present invention is not limited to description to be given below, and it is easily understood that modes and details thereof can be variously modified without departing from the purpose and the scope of the present invention. Accordingly, the present invention should not be construed as being limited to the description of the embodiments below.

Note that the position, the size, the range, or the like of each structure shown in drawings and the like is not accurately represented in some cases for simplification. Therefore, the disclosed invention is not necessarily limited to the position, the size, the range, or the like disclosed in the drawings and the like.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In describing structures of the invention with reference to the drawings in this specification and the like, common reference numerals are used for the same portions in different drawings.

Embodiment 1

In this embodiment, a light-emitting device of the present invention will be described below with reference to FIGS. 1 to 13.

<Structural Example 1 of Light-emitting Device>

Figure 1B:
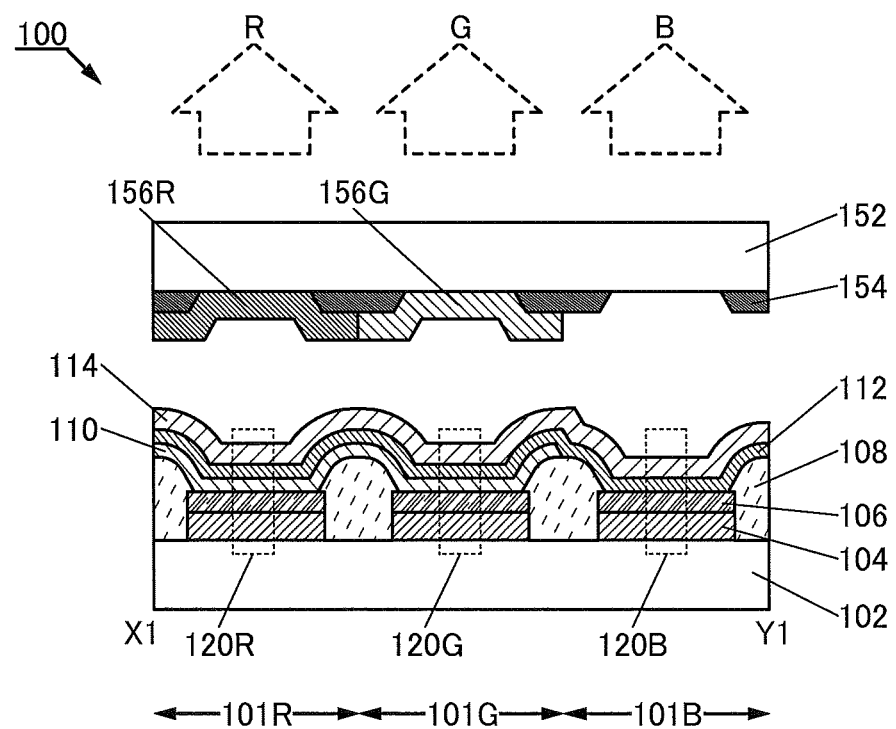

FIG. 1A is a plan view illustrating an example of a light-emitting device of one embodiment of the present invention. FIG. 1B is a cross-sectional view along dashed-dotted line X1-Y1 in FIG. 1A. A light-emitting device 100 illustrated in FIGS. 1A and 1B includes a first pixel 101R that emits light of a first color, a second pixel 101G that emits light of a second color, and a third pixel 101B that emits light of a third color. The first pixel 101R includes a first light-emitting element 120R and a first optical element 156R overlapping with the first light-emitting element 120R, the second pixel 101G includes a second light-emitting element 120G and a second optical element 156G overlapping with the second light-emitting element 120G, and the third pixel 101B includes a third light-emitting element 120B.

The first light-emitting element 120R and the second light-emitting element 120G each include, over a substrate 102, a first electrode 104, a first light-emitting layer 110 over the first electrode 104, a second light-emitting layer 112 over the first light-emitting layer 110, and a second electrode 114 over the second light-emitting layer 112. The third light-emitting element 120B includes the first electrode 104, the second light-emitting layer 112 over the first electrode 104, and the second electrode 114 over the second light-emitting layer 112. As illustrated in FIG. 1B, a transparent conductive film 106 may be provided over the first electrode 104.

The first optical element 156R and the second optical element 156G are provided below a substrate 152, and a light-blocking layer 154 which blocks light from an adjacent light-emitting element is also provided below the substrate 152. Note that the structure without the light-blocking layer 154 may be employed.

The light-emitting device 100 includes an insulating partition 108. The partition 108 covers an end portion of the lower electrode (the first electrode 104 and the transparent conductive film 106) and has an opening overlapping with the lower electrode (the first electrode 104 and the transparent conductive film 106).

The first light-emitting layer 110 includes a first light-emitting material having a spectrum peak in the range of higher than or equal to 540 nm and lower than or equal to 580 nm, and the second light-emitting layer 112 includes a second light-emitting material having a spectrum peak in the range of higher than or equal to 420 nm and lower than or equal to 480 nm. In other words, the first light-emitting layer 110 includes the first light-emitting material that exhibits yellow light emission, and the second light-emitting layer 112 includes the second light-emitting material that exhibits blue light emission. As the first light-emitting material and the second light-emitting material, any of light-emitting substances that convert singlet excitation energy into luminescence (e.g., fluorescent substance) and light-emitting substances that convert triplet excitation energy into luminescence (e.g., phosphorescent substance) may be used.

Thus, in the light-emitting device 100 illustrated in FIG. 1A, the first light-emitting layer 110 is shared between the first light-emitting element 120R and the second light-emitting element 120G, and the second light-emitting layer 112 is shared among the first light-emitting element 120R, the second light-emitting element 120G, and the third light-emitting element 120B. By sharing the first light-emitting layer 110 or the second light-emitting layer 112 among the light-emitting elements, the productivity in formation of the light-emitting elements can be increased. Specifically, in manufacturing the light-emitting elements of the light-emitting device 100, the number of steps for forming a layer on selected pixels can be only one (the step for depositing the first light-emitting layer 110), so that the productivity is increased.

The first pixel 101R emits red (R) light, the second pixel 101G emits green (G) light, and the third pixel 101B emits blue (B) light. Accordingly, by the first pixel 101R, the second pixel 101G, and the third pixel 101B, full-color display can be performed.

Yellow light is emitted from the first light-emitting element 120R included in the first pixel 101R, and the yellow light passes through the first optical element 156R to be converted into red light. This red light is emitted to the outside. Furthermore, yellow light is emitted from the second light-emitting element 120G included in the second pixel 101G, and the yellow light passes through the second optical element 156G to be converted into green light. This green light is emitted to the outside. In the first light-emitting element 120R and the second light-emitting element 120G, the second light-emitting layer 112 does not contribute to light emission. The third light-emitting element 120B included in the third pixel 101B emits blue light, and the blue light is emitted to the outside as it is without passing through any optical element or the like. In other words, the third pixel 101B does not include an optical element.

In this structure, as described above, light emitted from the third light-emitting element 120B is extracted to the outside without passing through any optical element. Accordingly, the light emitted from the third light-emitting element 120B is emitted with smaller loss than that of light emitted from the first light-emitting element 120R and the second light-emitting element 120G.

Accordingly, power consumption of the light-emitting device 100 can be low. In the case of using a blue fluorescent substance in the third light-emitting element 120B, the effect of reducing power consumption is significant. Note that in the case where an optical element is not provided for the third light-emitting element 120B, an optical element or a circularly polarizing plate may be provided depending on uses in order to prevent reflection of external light in the third light-emitting element.

In FIG. 1B, the red light, the green light, and the blue light emitted to the outside are schematically shown by arrows with broken lines, and such lights are similarly shown in the light-emitting devices described later. Thus, the light-emitting device 100 illustrated in FIGS. 1A and 1B is of a top-emission type in which light emitted from light-emitting elements is extracted to the side opposite to the substrate 102 side where the light-emitting elements are formed. However, one embodiment of the present invention is not limited to this type, and may be of a bottom-emission type in which light emitted from light-emitting elements is extracted to the substrate side where the light-emitting elements are formed, or a dual-emission type in which light emitted from light-emitting elements is extracted in both top and bottom directions of the substrate 102 where the light-emitting elements are formed.

Although the first pixel 101R, the second pixel 101G, and the third pixel 101B in the light-emitting device of one embodiment of the present invention are provided in a stripe arrangement in FIG. 1A as an example, they may be provided in any of the other arrangements. For example, a delta arrangement illustrated in FIG. 10A or a Pen-tile arrangement illustrated in FIG. 10B may be employed as the pixel arrangement of the light-emitting device of one embodiment of the present invention.

Here, other components of the light-emitting device 100 in FIGS. 1A and 1B are described below in detail.

<Substrate>

The substrate 102 is used as a support of the light-emitting elements. The substrate 152 is used as a support of the optical elements. For the substrate 102 and 152, glass, quartz, plastic, or the like can be used, for example. Alternatively, flexible substrates can be used. A flexible substrate is a substrate that can be bent; examples of the flexible substrate include a plastic substrate made of a polycarbonate, a polyarylate, or a polyethersulfone, and the like. A film (made of polypropylene, a polyester, poly(vinyl fluoride), poly(vinyl chloride), or the like), an inorganic vapor-deposited film, or the like can be used. Another material may be used as long as the substrate functions as a support in a manufacturing process of the light-emitting elements or the optical elements.

<First Electrode>

The first electrode 104 functions as a lower electrode or an anode in each of the light-emitting elements. Note that the first electrode 104 is preferably formed of a conductive material having reflectivity. As the conductive material, a conductive material having a visible light reflectivity of higher than or equal to 40% and lower than or equal to 100%, preferably higher than or equal to 70% and lower than or equal to 100%, and a resistivity of lower than or equal to $1\times10^{-2}$ $\Omega$cm can be used. Specifically, as the first electrode 104, silver, aluminum, an alloy containing silver or aluminum, or the like can be used. As the alloy containing aluminum, an alloy containing aluminum, nickel, and lanthanum can be used, for example. As the alloy containing silver, an alloy containing silver, palladium, and copper can be used, for example. The first electrode 104 can be formed by a sputtering method, an evaporation method, a printing method, a coating method, or the like. In FIG. 1B, the first electrode 104 is provided in an island shape in each of the light-emitting elements. For this reason, in order to identify those first electrodes 104 of the light-emitting elements from each other, they are referred to as a third electrode, a fourth electrode, and a fifth electrode, in some cases.

<Transparent Conductive Film>

The transparent conductive film 106 functions as a lower electrode or an anode in each of the light-emitting elements. Furthermore, the transparent conductive film 106 is used to adjust the optical length between the first electrode 104 and the second electrode 114 in accordance with the desired light wavelength so as to produce resonance of the desired light emitted from the light-emitting layer and increase the intensity of the light of the wavelength. For example, the thickness of the transparent conductive film 106 is adjusted so that the optical length between the electrodes can be m$\lambda$/2 (in is a natural number), where $\lambda$ is the wavelength of desired light. Note that specific structures concerning the optical length between the electrodes will be described later.

As the transparent conductive film 106, for example, indium oxide-tin oxide (indium tin oxide (hereinafter referred to as ITO)), indium oxide-tin oxide containing silicon or silicon oxide, indium oxide-zinc oxide (indium zinc oxide), indium oxide containing tungsten oxide and zinc oxide, or the like can be used. In particular, a material with a large work function (4.0 eV or more) is preferably used as the transparent conductive film 106. The transparent conductive film 106 can be formed by a sputtering method, an evaporation method, a printing method, a coating method, or the like.

<Second Electrode>

The second electrode 114 functions as an upper electrode or a cathode in each of the light-emitting elements. The second electrode 114 is preferably formed of a conductive material having reflectivity and a conductive material having a light-transmitting property. As the conductive materials, a conductive material having a visible light reflectivity of higher than or equal to 20% and lower than or equal to 80%, preferably higher than or equal to 40% and lower than or equal to 70%, and a resistivity of lower than or equal to $1\times10^{-2}$ $\Omega$cm can be used. The second electrode 114 can be formed using one or more kinds of conductive metals, alloys, conductive compounds, and the like. In particular, it is preferable to use a material with a small work function (3.8 eV or less). For example, aluminum, silver, an element belonging to Group 1 or 2 of the periodic table (e.g., an alkali metal such as lithium or cesium, an alkaline earth metal such as calcium or strontium, or magnesium), an alloy containing any of these elements (e.g., Mg—Ag or Al—Li), a rare earth metal such as europium or ytterbium, an alloy containing any of these rare earth metals, or the like can be used. The second electrode 114 can be formed by a sputtering method, an evaporation method, a printing method, a coating method, or the like.

<Partition>

The partition 108 has an insulating property and is formed using an inorganic or organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

<Light-Emitting Layer>

The first light-emitting layer 110 includes the first light-emitting material having a spectrum peak in the range of higher than or equal to 540 nm and lower than or equal to 580 nm or lower, and the second light-emitting layer 112 includes the second light-emitting material having a spectrum peak in the range of higher than or equal to 420 nm and lower than or equal to 480 nm. The first light-emitting layer 110 includes either or both of an electron-transport material and a hole-transport material in addition to the first light-emitting material. The second light-emitting layer 112 includes either or both of an electron-transport material and a hole-transport material in addition to the second light-emitting material.

As the first light-emitting material and the second light-emitting material, any of light-emitting substances that convert singlet excitation energy into luminescence and light-emitting substances that convert triplet excitation energy into luminescence can be used. Examples of the light-emitting substances are described below.

Examples of the light-emitting substances that convert singlet excitation energy into luminescence include substances that emit fluorescence. For example, substances which exhibit blue light emission (emission wavelength: 400 nm to 480 nm) such as N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl)triphenylamine (abbreviation: PCBAPBA), perylene, 2,5,8,11-tetra(tert-butyl)perylene (abbreviation: TBP), N,N'-bis[4-(9-phenyl-9H-fluoren-9-yl)phenyl]-N,N'-diphenylpyrene-1,6-diamine (abbreviation: 1,6FLPAPrn), and N,N'-bis(3-methylphenyl)-N,N'-bis[3-(9-phenyl-9H-fluoren-9-yl)phenyl]pyrene-1,6-diamine (abbreviation: 1,6mMemFLPAPrn) and substances which exhibit yellow light emission (emission wavelength: 540 nm to 580 nm) such as rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), and 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2) can be used.

Examples of the light-emitting substances that convert triplet excitation energy into luminescence include substances that emit phosphorescence. For example, substances which exhibit blue light emission (emission wavelength: 400 nm to 480 nm) such as bis[2-(4',6'-difluorophenyl)pyridinato-N,C2']iridium(III) tetrakis(1-pyrazolyl)borate (abbreviation: FIr6), bis[2-(4',6'-difluorophenyl)pyridinato-N,C2']iridium(III)picolinate (abbreviation: FIrpic), tris{2-[5-(2-methylphenyl)-4-(2,6-dimethylphenyl)-4H-1,2,4-triazol-3-yl-κN2]phenyl-κC} iridium(III) (abbreviation: Ir(mpptz-dmp)$_3$), tris[3-(5-biphenyl)-5-isopropyl-4-phenyl-4H-1,2,4-triazolato]iridium(III) (abbreviation: Ir(iPr5btz)$_3$), tris[3-methyl-1-(2-methylphenyl)-5-phenyl-1H-1,2,4-triazolato]iridium(III) (abbreviation: Ir(Mptz1-mp)$_3$), tris[1-methy-5-phenyl-3-propyl-1H-1,2,4-triazolato]iridium(III) (abbreviation: Ir(Prptz1-Me)$_3$), fac-tris[1-(2,6-diisopropylphenyl)-2-phenyl-1H-imidazole]iridium(III) (abbreviation: Ir(iPrpmi)$_3$), and tris [3-(2,6-dimethylphenyl)-7-methylimidazo[1,2-f]phenanthridinato]iridium(III) (abbreviation: Ir(dmpimpt-Me)$_3$), and substances which exhibit yellow light emission (emission wavelength: 540 nm to 580 nm) such as (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium (III) (abbreviation: Ir(tBuppm)$_2$(acac)), (acetylacetonato)bis [6-(2-norbornyl)-4-phenylpyrimidinato]iridium(III) (abbreviation: Ir(nbppm)$_2$(acac)), (acetylacetonato)bis [5-methyl-6-(2-methylphenyl)-4-phenylpyrimidinato] iridium(III) (abbreviation: Ir(mpmppm)$_2$(acac)), (acetylacetonato)bis {4, 6-dimethyl-2-[6-(2,6-dimethylphenyl)-4-pyrimidinyl-κN3]phenyl-κC}iridium(III) (abbreviation: Ir(dmppm-dmp)$_2$(acac)), (acetylacetonato)bis(4,6-diphenylpyrimidinato)iridium(III) (abbreviation: Ir(dppm)$_2$ (acac)), (acetylacetonato)bis(3,5-dimethyl-2-phenylpyrazinato)iridium(III) (abbreviation Ir(mppr-Me)$_2$(acac)), (acetylacetonato)bis(5-isopropyl-3-methyl-2-phenylpyrazinato)iridium(III) (abbreviation: Ir(mppr-iPr)$_2$(acac)), tris(2-phenylquinolinato-N,C2')iridium(III) (abbreviation: Ir(pq)$_3$), bis(2-phenylquinolinato-N,C2')iridium(III)acetylacetonate (abbreviation: Ir(pq)$_2$(acac)), bis(benzo[h]quinolinato)iridium(III)acetylacetonate (abbreviation: Ir(bzq)$_2$ (acac)), bis(2,4-diphenyl-1,3-oxazolato-N,C2')iridium(III) acetylacetonate (abbreviation: Ir(dpo)$_2$(acac)), bis{2-[4'-(perfluorophenyl)phenyl]pyridinato-N,C2'}iridium(III) acetylacetonate (abbreviation: Ir(p-PF-ph)$_2$(acac)), and bis (2-phenylbenzothiazolato-N,C2')iridium(III) acetylacetonate (abbreviation: Ir(bt)$_2$(acac)) can be used.

As the electron-transport material used in the light-emitting layer 110 and the second light-emitting layer 112, a π-electron deficient heteroaromatic compound such as a nitrogen-containing heteroaromatic compound is preferable, examples of which include quinoxaline derivatives and dibenzoquinoxaline derivatives such as 2[3-(dibenzothiophen-4-yl)phenyl]dibenzo[f,h]quinoxaline (abbreviation: 2mDBTPDBq-II), 2- [3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7[3-(dibenzothiophen-4-yflphenyl]dibenzo[f,h]quinoxaline (abbreviation: 7mDBTPDBq-II), and 6-[3-(dibenzothiophen-4-yl)phenyl]dibenzo quinoxaline (abbreviation: 6mDBTPDBq-II).

As the hole-transport material used in the first light-emitting layer 110 and the second light-emitting layer 112, a π-electron rich heteroaromatic compound (e.g., a carbazole derivative or an indole derivative) or an aromatic amine compound is preferable, examples of which include 4-phenyl-4'-(9-phenyl-9H-carbazol-3-yl)triphenylamine (abbreviation: PCBA1BP), 4,4'-di(1-naphthyl)-4"-(9-phenyl-9H-carbazol-3-yl)triphenylamine (abbreviation: PCBNBB), 3-[N-(1-naphthyl)-N-(9-phenylcarbazol-3-yl)amino]-9-phenylcarbazole (abbreviation: PCzPCN1), 4,4',4"-tris[N-(1-naphthyl)-N-phenylamino]triphenylamine (abbreviation: 1'-TNATA), 2,7-bis[N-(4-diphenylaminophenyl)-N-phenylamino]-spiro-9,9'-bifluorene (abbreviation: DPA2SF), N,N'-bis(9-phenylcarbazol-3-yl)-N,N'-diphenylbenzene-1,3-diamine (abbreviation: PCA2B), N-(9,9-dimethyl-2-diphenylamino-9H-fluoren-7-yl)diphenylamine (abbreviation: DPNF), N,N',N"-triphenyl-N,N',N"-tris(9-phenylcarbazol-3-yl)benzene-1,3,5-triamine (abbreviation: PCA3B), 2-[N-(9-phenylcarbazol-3-yl)-N-phenylamino]spiro-9,9'-bifluorene (abbreviation: PCASF), 2-[N-(4-diphenylaminophenyl)-N-phenylamino] spiro-9,9'-bifluorene (abbreviation: DPASF), N,N'-bis[4-(carbazol-9-yl)phenyl]-N,N'-diphenyl-9,9-dimethylfluorene-2,7-diamine (abbreviation: YGA2F), 4,4'-bis[N-(3-methylphenyl)-N-phenylamino]biphenyl (abbreviation: TPD), 4,4'-bis[N-(4-diphenylaminophenyl)-N-phenylamino]biphenyl (abbreviation: DPAB), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), 3-[N-(9- phenylcarbazol-3-yl)-N-phenylamino]-9-phenylcarbazole (abbreviation: PCzPCA1), 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 4,4'-bis(N-{4-[N'-(3-methylphenyl)-N'-phenylamino]phenyl}-N-phenylamino)biphenyl (abbreviation: DNTPD), 3,6-bis [N-(4-diphenylaminophenyl)-N-(1-naphthyl)amino]-9-phenylcarbazole (abbreviation: PCzTPN2), and 3,6-bis[N-(9-phenylcarbazol-3-yl)-N-phenylamino]-9-phenylcarbazole (abbreviation: PCzPCA2).

<Light-Blocking Layer>

The light-blocking layer 154 has a function of reducing the reflection of external light. The light-blocking layer 154 has a function of preventing mixture of light emitted from an adjacent light-emitting element. As the light-blocking layer 154, a metal, a resin containing black pigment, carbon black, a metal oxide, a composite oxide containing a solid solution of a plurality of metal oxides, or the like can be used.

<Light-Emitting Element>

The first optical element 156R and the second optical element 156G selectively transmit light with a particular color out of incident light. For example, a color filter, a band pass filter, a multilayer filter, or the like can be used, for example. Color conversion elements can be used as the optical elements. A color conversion element is an optical element that converts incident light into light having a longer wavelength than the incident light. As the color conversion elements, quantum-dot elements are favorably used. The usage of the quantum-dot type can increase color reproducibility of the light-emitting device.

The first optical element 156R transmits red light out of light emitted from the first light-emitting element 120R. In addition, the second optical element 156G transmits green light out of light emitted from the second light-emitting element 120G.

Note that an optical element may be provided so as to overlap with the third light-emitting element 120B, or a plurality of optical elements may be provided so as to overlap with the first light-emitting element 120R and/or the second light-emitting element 120G. As another optical element, a circularly polarizing plate, an anti-reflective film, or the like can be provided, for example. A circularly polarizing plate provided on the side where light emitted from the light-emitting element of the light-emitting device is extracted can prevent a phenomenon in which light entering from the outside of the light-emitting device is reflected inside the light-emitting device and returned to the outside. An anti-reflective film can weaken external light reflected by a surface of the light-emitting device. Accordingly, light emitted from the light-emitting device can be observed clearly.

<Structural Example 2 of Light-Emitting Device>

Next, structure examples different from the light-emitting device 100 illustrated in FIGS. 1A and 1B will be described below with reference to FIGS. 2A and 2B.

FIGS. 2A and 2B are cross-sectional views each illustrating an example of the light-emitting device of embodiment of the present invention. Plan views of the light-emitting devices of FIGS. 2A and 2B are omitted here because they are similar to the plan view of the light-emitting device 100 illustrated in FIG. 1A.

A light-emitting device 100A illustrated in FIG. 2A includes a first pixel 101R that emits light of a first color, a second pixel 101G that emits light of a second color, and a third pixel 101B that emits light of a third color. The first pixel 101R includes a first light-emitting element 121R and a first optical element 156R overlapping with the first light-emitting element 121R, the second pixel 101G includes a second light-emitting element 121G and a second optical element 156G overlapping with the second light-emitting element 121G, and the third pixel 101B includes a third light-emitting element 121B.

The first light-emitting element 121R includes a first electrode 104, a first transparent conductive film 106R over the first electrode 104, a first light-emitting layer 110 over the first transparent conductive film 106R, a second light-emitting layer 112 over the first light-emitting layer 110, and a second electrode 114 over the second light-emitting layer 112. The second light-emitting element 121 G includes the first electrode 104, a second transparent conductive film 106G over the first electrode 104, the first light-emitting layer 110 over the second transparent conductive film 106G, the second light-emitting layer 112 over the first light-emitting layer 110, and the second electrode 114 over the second light-emitting layer 112. The third light-emitting element 121B includes the first electrode 104, a third transparent conductive film 106B over the first electrode 104, the second light-emitting layer 112 over the third transparent conductive film 106B, and the second electrode 114 over the second light-emitting layer 112.

The light-emitting device 100A illustrated in FIG. 2A is different from the light-emitting device 100 illustrated in FIG. 1B in including the first light-emitting element 121R, the second light-emitting element 121G, and the third light-emitting element 121B. Note that the first light-emitting element 121R, the second light-emitting element 121G, and the third light-emitting element 121B have a microcavity structure. By employing the microcavity structure for the light-emitting elements, light of specific wavelengths can be efficiently extracted from light emitted from the light-emitting elements.

Light emitted from the first light-emitting layer 110 and the second light-emitting layer 112 resonates between the first electrode 104 and the second electrode 114. In the light-emitting device 100A, the thicknesses of the first transparent conductive film 106B, the second transparent conductive film 106G, and the third transparent conductive film 106B in the light-emitting elements are adjusted, so that the intensity of light emitted from the first light-emitting layer 110 and the second light-emitting layer 112 can be increased.

Specifically, the thicknesses of the first transparent conductive film 106B, the second transparent conductive film 106G, and the third transparent conductive film 106B are adjusted so that the optical length between the first electrode 104 and the second electrode 114 can be $m\lambda/2$ (in is a natural number), where $\lambda$ is the wavelength of desired light. Furthermore, the thicknesses of the first transparent conductive film 106R, the second transparent conductive film 106G, and the third transparent conductive film 106B are adjusted so that the optical length between the first electrode 104 and the light-emitting layer (the first light-emitting layer 110 and the second light-emitting layer 112) can be $(2m'+1)\lambda/4$ (m' is a natural number), where $\lambda$ is the wavelength of desired light.

Note that the optical length between the first electrode 104 and the second electrode 114 is, to be exact, represented by the product of a refractive index and a film thickness from a reflective region in the first electrode 104 to a reflective region in the second electrode 114. However, it is difficult to exactly determine the reflective regions in the first electrode 104 and the second electrode 114; thus, it is assumed that the above effect can be sufficiently obtained wherever the reflective regions may be set in the first electrode 104 and the second electrode 114.

Furthermore, the optical length between the first electrode 104 and the light-emitting layer emitting desired light is, to be exact, the optical length between the reflective region in the first electrode 104 and the light-emitting region in the light-emitting layer emitting desired light. However, it is difficult to exactly determine the reflective region in the first electrode 104 and the light-emitting region in the light-emitting layer emitting desired light; thus, it is assumed that the above effect can be sufficiently obtained wherever the reflective region and the light-emitting region may be set in the first electrode 104 and the light-emitting layer emitting desired light.

The thicknesses of the first transparent conductive film 106R, the second transparent conductive film 106G, and the third transparent conductive film 106B have the following relation: the first transparent conductive film 106R>the second transparent conductive film 106G>the third transparent conductive film 106B. In other words, the first transparent conductive film 106R includes a first region having a first thickness, the second transparent conductive film 106G includes a second region having a second thickness, and the third transparent conductive film 106B includes a third region having a third thickness. The first thickness is larger than the second thickness, and the second thickness is larger than the third thickness. For example, ITO films with thicknesses of 100 nm, 60 nm, and 20 nm are used as the first transparent conductive film 106B, the second transparent conductive film 106G, and the third transparent conductive film 106B, respectively. When the thicknesses of the first transparent conductive film 106R, the second transparent conductive film 106G, and the third transparent conductive film 106B satisfy the above relation, light of specific wavelengths can be efficiently extracted from light emitted from the light-emitting elements.

A light-emitting device 100B illustrated in FIG. 2B includes a first pixel 101R that emits light of a first color, a second pixel 101G that emits light of a second color, and a third pixel 101B that emits light of a third color. The first pixel 101R includes a first light-emitting element 122R and a first optical element 156R overlapping with the first light-emitting element 122R, the second pixel 101G includes a second light-emitting element 122G and a second optical element 156G overlapping with the second light-emitting element 122G, and the third pixel 101B includes a third light-emitting element 122B.

Furthermore, the first light-emitting element 122R and the second light-emitting element 122G each include a first electrode 104, a first transparent conductive film 106 over the first electrode 104, a hole-injection layer 131 over the first transparent conductive film 106, a hole-transport layer 132 over the hole-injection layer 131, a first light-emitting layer 110 over the hole-transport layer 132, a second light-emitting layer 112 over the first light-emitting layer 110, an electron-transport layer 133 over the second light-emitting layer 112, an electron-injection layer 134 over the electron-transport layer 133, and a second electrode 114 over the electron-injection layer 134. In addition, the third light-emitting element 122B includes the first electrode 104, the first transparent conductive film 106 over the first electrode 104, the hole-injection layer 131 over the first transparent conductive film 106, the hole-transport layer 132 over the hole-injection layer 131, the second light-emitting layer 112 over the hole-transport layer 132, the electron-transport layer 133 over the second light-emitting layer 112, the electron-injection layer 134 over the electron-transport layer 133, and the second electrode 114 over the electron-injection layer 134.

The light-emitting device 100B is different from the light-emitting device 100 in including the first light-emitting element 122R, the second light-emitting element 122G, and the third light-emitting element 122B.

Thus, in the light-emitting device 100B illustrated in FIG. 2B, the first light-emitting layer 110 is shared between the first light-emitting element 122R and the second light-emitting element 122G, and the second light-emitting layer 112 is shared among the first light-emitting element 122R, the second light-emitting element 122G, and the third light-emitting element 122B. Furthermore, the hole-injection layer 131, the hole-transport layer 132, the electron-transport layer 133, and the electron-injection layer 134 which are included in the first light-emitting element 122R, the second light-emitting element 122G, and the third light-emitting element 122B are each shared among the light-emitting elements. In other words, for forming each of the hole-injection layer 131, the hole-transport layer 132, the electron-transport layer 133, and the electron-injection layer 134 in each light-emitting element, a plurality of steps are not necessary. Accordingly, in manufacturing the light-emitting elements of the light-emitting device 100B, the number of steps for forming a layer on selected pixels can be only one (the step for depositing the first light-emitting layer 110).

Here, details of the hole-injection layer 131, the hole-transport layer 132, the electron-transport layer 133, and the electron-injection layer 134 included in the light-emitting device 100B will be described.

<Hole-Injection Layer and Hole-Transport Layer>

The hole-injection layer 131 is a layer that injects holes into the first light-emitting layer 110 and the second light-emitting layer 112 through the hole-transport layer 132 with a high hole-transport property and includes a hole-transport material and an acceptor material. When a hole-transport material and an acceptor material are included, electrons are extracted from the hole-transport material by the acceptor material to generate holes, and the holes are injected into the first light-emitting layer 110 and the second light-emitting layer 112 through the hole-transport layer 132. The hole-injection layer 131 may have a structure in which a hole-transport material and an acceptor material are stacked. Note that the hole-transport layer 132 is formed using a hole-transport material.

Specific examples of the hole-transport materials used for the hole-injection layers 131 and 132 include aromatic amine compounds such as 4,4'-bis[N-(1-naphthyl)-N-phenylamino]biphenyl (abbreviation: NPB or a-NPD), N,N'-bis (3-methylphenyl)-N,N-diphenyl-[1,1'biphenyl]-4,4'-diamine (abbreviation: TPD), 4,4',4"-tris(carbazol-9-yl) triphenylamine (abbreviation: TCTA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); and 3-[N-(1-naphthyl)-N-(9-phenylcarbazol-3-yl)amino]-9-phenylcarbazole (abbreviation: PCzPCN1). Alternatively, the following carbazole derivatives can be used: 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)

phenyl]-9H-carbazole (abbreviation: CzPA). These materials described here are mainly substances having a hole mobility of greater than or equal to $10^{-6}$ cm$^2$/Vs. Note that other than the above-described substances, a substance that has a property of transporting more holes than electrons may be used.

A high molecular compound such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino }phenyl)methacrylamide] (abbreviation: PTPDMA), or poly[N,N'-bis(4-butylphenyl)-N,N'-bis(phenyl)benzidine](abbreviation: Poly-TPD) can also be used.

Examples of the acceptor material used in the hole-injection layer 131 include compounds having an electron-withdrawing group (a halogen group or a cyano group) such as 7,7,8,8-tetracyano-2,3,5,6-tetrafluoroquinodimethane (abbreviation: F$_4$-TCNQ), chloranil, and 2,3,6,7,10,11-hexacyano-1,4,5,8,9,12-hexaazatriphenylene (HAT-CN). In particular, a compound in which electron-withdrawing groups are bonded to a condensed aromatic ring having a plurality of hetero atoms, like HAT-CN, is thermally stable and preferable. Furthermore, the examples also include transition metal oxides. Moreover, the examples include oxides of metals belonging to Groups 4 to 8 of the periodic table. Specifically, it is preferable to use vanadium oxide, niobium oxide, tantalum oxide, chromium oxide, molybdenum oxide, tungsten oxide, manganese oxide, and rhenium oxide because of their high electron accepting properties. Among them, molybdenum oxide is particularly preferable because of its stability in the atmosphere, low hygroscopic property, and easiness of handling.

Note that the hole-injection layer 131 may be formed of the above-described acceptor material alone or of the above-described acceptor material and another material in combination. In this case, the acceptor material extracts electrons from the hole-transport layer, so that holes can be injected into the hole-transport layer. The acceptor material transfers the extracted electrons to the anode.

<Electron-Transport Layer>

The electron-transport layer 133 is a layer including a substance with a high electron-transport property. For the electron-transport layer 133, a metal complex such as Alq$_3$, tris(4-methyl-8-quinolinolato)aluminum (abbreviation: Almq$_3$), bis(10-hydroxybenzo[h]quinolinato)beryllium (abbreviation: BeBq$_2$), BAlq, Zn(BOX)$_2$, or bis[2-(2-hydroxyphenyl)benzothiazolato]zinc (abbreviation: Zn(BTZ)$_2$) can be used. Furthermore, a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or 4,4'-bis(5-methylbenzoxazol-2-yl)stilbene (abbreviation: BzOs) can also be used. Further alternatively, it is possible to use a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)](abbreviation: PF-BPy). The substances mentioned here are mainly substances each having an electron mobility of $1 \times 10^{-6}$ cm$^2$/Vs or higher. However, substances other than the above described substances may also be used in the electron-transport layer 133 as long as the substances have higher electron-transport properties than hole-transport properties.

The electron-transport layer 133 is not limited to a single layer, and may be a stack of two or more layers each containing any of the above-described substances.

<Electron-Injection Layer>

The electron-injection layer 134 is a layer including a substance with a high electron-injection property. For the electron-injection layer 134, an alkali metal, an alkaline earth metal, or a compound thereof, such as lithium fluoride (LiF), cesium fluoride (CsF), calcium fluoride (CaF$_2$), or lithium oxide (LiO$_x$), can be used. Alternatively, a rare earth metal compound like erbium fluoride (ErF$_3$) can be used. Electride may also be used for the electron-injection layer 134. Examples of the electride include a substance in which electrons are added at high concentration to calcium oxide-aluminum oxide.

Alternatively, the electron-injection layer 134 may be formed using a composite material in which an organic compound and an electron donor (donor) are mixed. The composite material is superior in an electron-injection property and an electron-transport property, since electrons are generated in the organic compound by the electron donor. The organic compound here is preferably a material excellent in transporting the generated electrons; specifically, for example, the substances for forming the electron-transport layer 133 (e.g., a metal complex or a heteroaromatic compound) can be used. As the electron donor, a substance showing an electron-donating property with respect to the organic compound may be used. Specifically, an alkali metal, an alkaline earth metal, and a rare earth metal are preferable, and lithium, cesium, magnesium, calcium, erbium, ytterbium, and the like are given. Furthermore, an alkali metal oxide or an alkaline earth metal oxide is preferable, and for example, lithium oxide, calcium oxide, barium oxide, and the like can be given. Alternatively, Lewis base such as magnesium oxide can also be used. An organic compound such as tetrathiafulvalene (abbreviation: TTF) can also be used.

Note that the above-described light-emitting layer, the hole-transport layer, the hole-injection layer, the electron-transport layer, and the electron-injection layer can each be formed by any of the following methods: a sputtering method, an evaporation method (including a vacuum evaporation method), a printing method (such as relief printing, intaglio printing, gravure printing, planography printing, and stencil printing), an ink jet method, a coating method, and the like.

As described above, the light-emitting device 100B has a structure where each light-emitting element includes a hole-transport layer, a hole-injection layer, an electron-transport layer, and an electron-injection layer. The other structures are similar to those of the light-emitting device 100 illustrated in FIGS. 1A and 1B and have similar effects.

<Structural Example 3 of Light-Emitting Device>

Next, a structure example different from the light-emitting device 100 illustrated in FIGS. 1A and 1B will be described below with reference to FIGS. 3A and 3B.

Figure 3A:
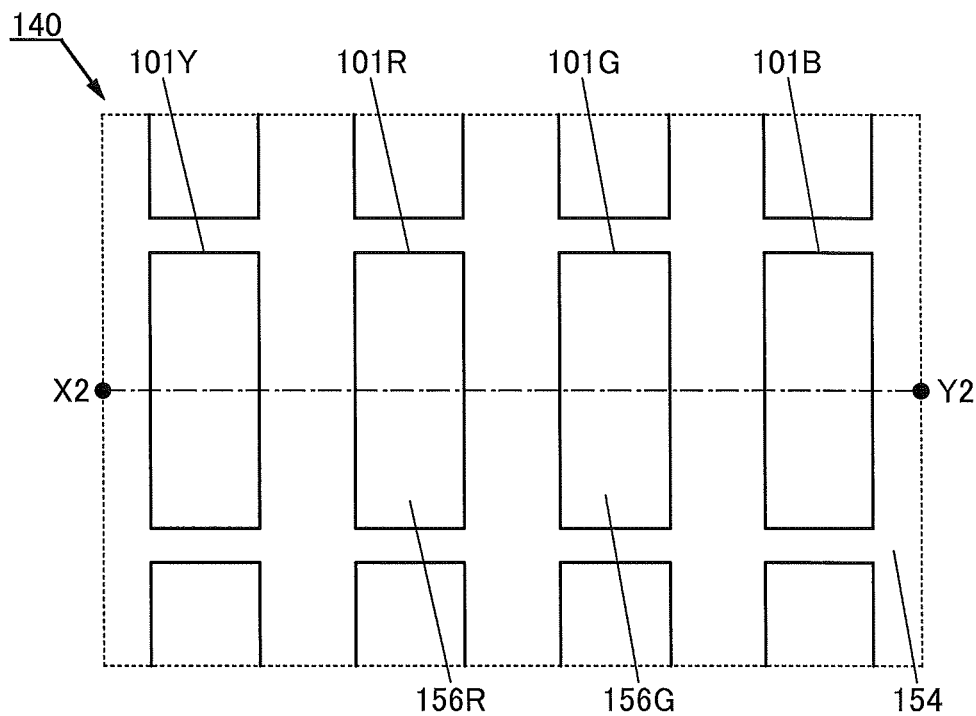
FIGS. 3A and 3B are a plan view and a cross-sectional view, respectively, of a light-emitting device of one embodiment of the present invention.

FIG. 3A is a plan view illustrating an example of a light-emitting device of one embodiment of the present invention. FIG. 3B is a cross-sectional view along dashed-dotted line X2-Y2 in FIG. 3A. A light-emitting device 140 illustrated in FIGS. 3A and 3B includes a first pixel 101R that emits light of a first color, a second pixel 101G that emits light of a second color, a third pixel 101B that emits light of a third color, and a fourth pixel 101Y that emits light of a fourth color. The first pixel 101R includes a first light-emitting element 120R and a first optical element 156R overlapping with the first light-emitting element 120R, the second pixel 101G includes a second light-emitting element 120G and a second optical element 156G overlapping with the second light-emitting element 120G, the third pixel 101B includes a third light-emitting element 120B, and the fourth pixel 101Y includes a fourth light-emitting element 120Y.

The first light-emitting element 120R, the second light-emitting element 120G, and the fourth light-emitting element 120Y each include a first electrode 104, a first light-emitting layer 110 over the first electrode 104, a second light-emitting layer 112 over the first light-emitting layer 110, and a second electrode 114 over the second light-emitting layer 112. The third light-emitting element 120B includes the first electrode 104, the second light-emitting layer 112 over the first electrode 104, and the second electrode 114 over the second light-emitting layer 112. As illustrated in FIG. 3B, a transparent conductive film 106 may be provided over the first electrode 104.

Thus, in the light-emitting device 140, the first light-emitting layer 110 is shared among the first light-emitting element 120R, the second light-emitting element 120G, and the fourth light-emitting element 120Y, and the second light-emitting layer 112 is shared among the first light-emitting element 120R, the second light-emitting element 120G, the third light-emitting element 120B, and the fourth light-emitting element 120Y. By sharing the first light-emitting layer 110' or the second light-emitting layer 112 among the light-emitting elements, the productivity in formation of the light-emitting elements can be increased. Specifically, in manufacturing the light-emitting elements of the light-emitting device 140, the number of steps for forming a layer on selected pixels can be only one (the step for depositing the first light-emitting layer 110), so that the productivity is increased.

The first pixel 101R emits red (R) light, the second pixel 101G emits green (G) light, the third pixel 101B emits blue (B) light, and the fourth pixel 101Y emits yellow (Y) light. Accordingly, by the first pixel 101R, the second pixel 101G, the third pixel 101B, and the fourth pixel 101Y, full-color display can be performed.

Since the light-emitting device 140 includes the fourth pixel 101Y in addition to the first pixel 101R, the second pixel 101G, and the third pixel 101B, color reproducibility can be increased. By including the fourth pixel 101Y, the light-emitting device 140 can have reduced power consumption. 10.

Yellow light is emitted from the first light-emitting element 120R included in the first pixel 101R, and the yellow light passes through the first optical element 156R to be converted into red light. This red light is emitted to the outside. Furthermore, yellow light is emitted from the second light-emitting element 120G included in the second pixel 101G, and the yellow light passes through the second optical element 156G to be converted into green light. This green light is emitted to the outside. Moreover, yellow light is emitted from the fourth light-emitting element 120Y included in the fourth pixel 101Y, and the yellow light is emitted to the outside as it is without passing through any optical element and the like. Note that in the first light-emitting element 120R, the second light-emitting element 120G, and the fourth light-emitting element 120Y, the second light-emitting layer 112 does not contribute to light emission. The third light-emitting element 120B included in the third pixel 101B emits blue light, and the blue light is emitted to the outside as it is without passing through any optical element or the like. In other words, the third pixel 101B and the fourth pixel 101Y do not include an optical element. Accordingly, light emitted from the third light-emitting element 120B and the fourth light-emitting element 120Y is extracted to the outside without passing through any optical element. In other words, the light emitted from the third light-emitting element 120B and the fourth light-emitting element 120Y is emitted with smaller loss than that of light emitted from the first light-emitting element 120R and the second light-emitting element 120G.

Accordingly, power consumption of the light-emitting device 140 can be low. In the case of using a blue fluorescent substance in the third light-emitting element 120B, this effect of reducing power consumption is significant. Note that in the case where an optical element is not provided for the third light-emitting element 120B and the fourth light-emitting element 120Y, an optical element or a circularly polarizing plate may be provided depending on uses in order to prevent reflection of external light in the third light-emitting element 120B and the fourth light-emitting element 120Y.

Figure 3B:
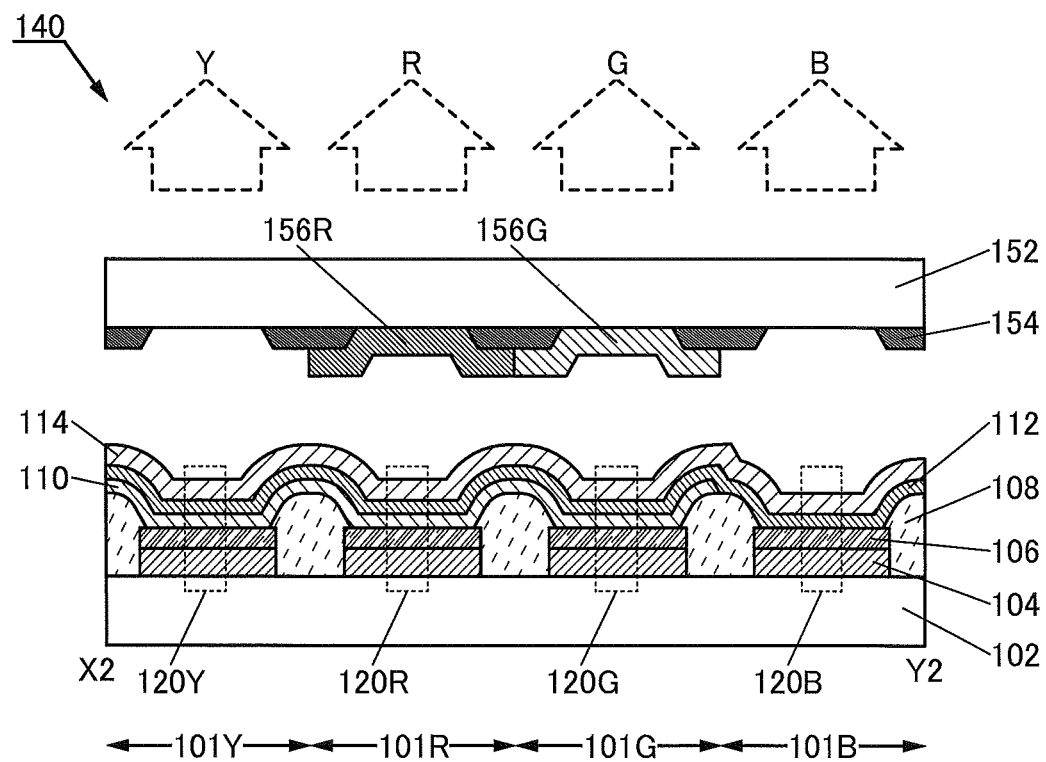

The other structures of the light-emitting device 140 illustrated in FIGS. 3A and 3B are similar to those of the light-emitting device 100 illustrated in FIGS. 1A and 1B and have similar effects.

<Structural Example 4 of Light-Emitting Device>

Next, structure examples different from the light-emitting device 140 illustrated in FIGS. 3A and 3B will be described below with reference to FIGS. 4A and 4B.

Figure 4A:
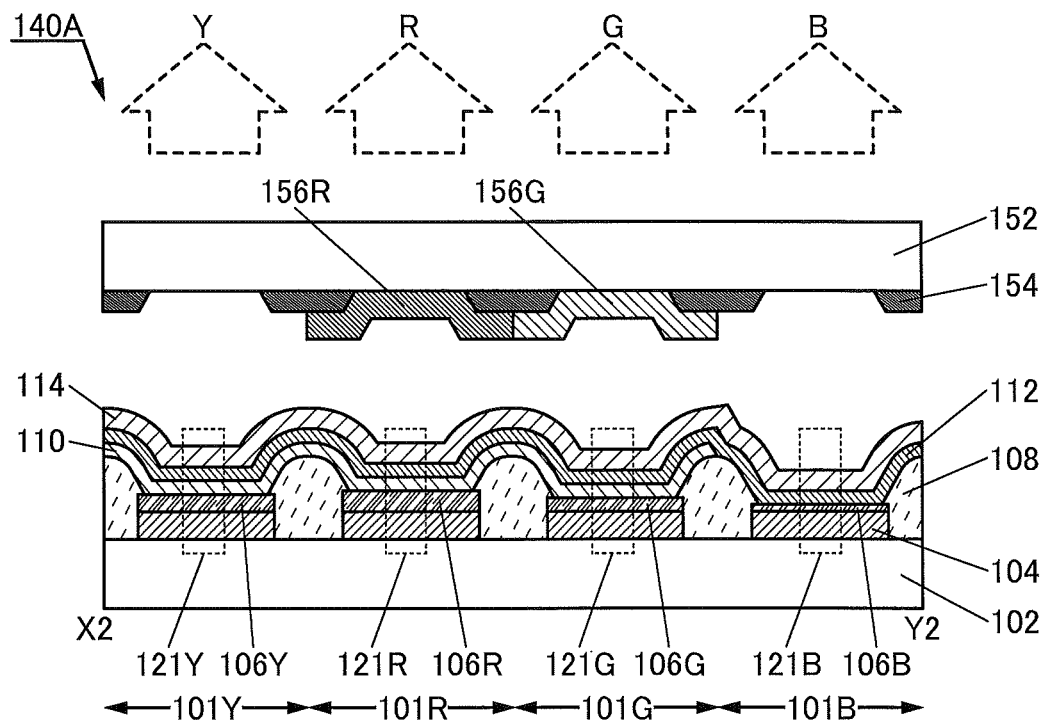
FIGS. 4A and 4B are each a cross-sectional view of a light-emitting device of one embodiment of the present invention.
Figure 4B:
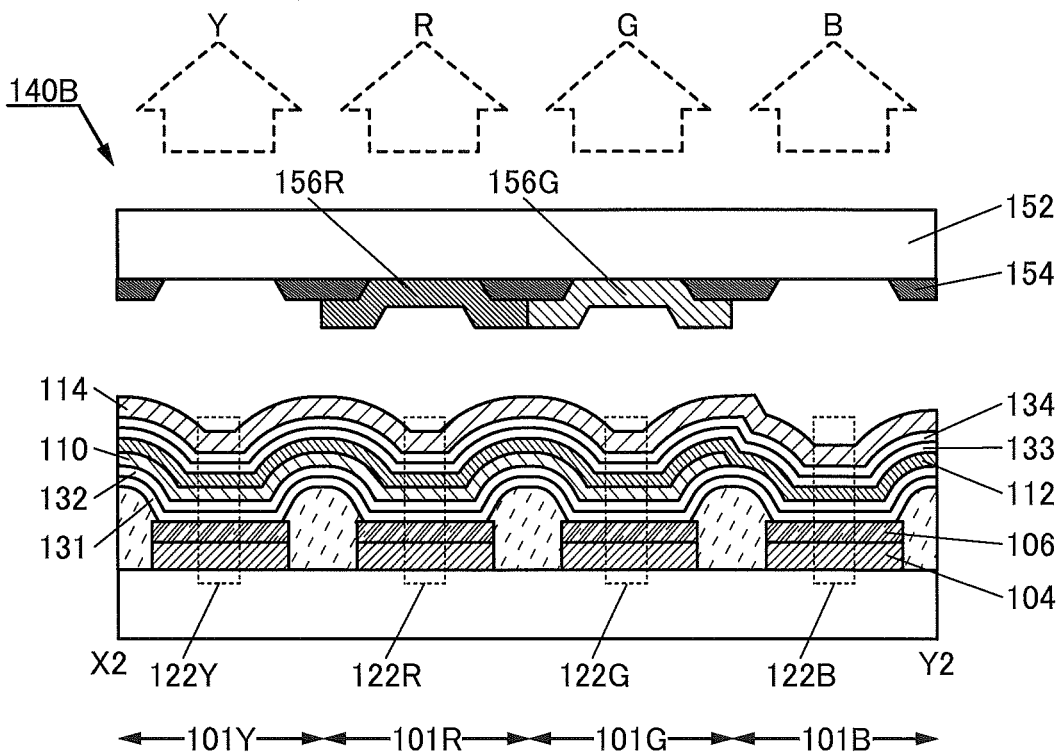

FIGS. 4A and 4B are cross-sectional views each illustrating an example of the light-emitting device of embodiment of the present invention. Plan views of the light-emitting devices of FIGS. 4A and 4B are omitted here because they are similar to the plan view of the light-emitting device 140 illustrated in FIG. 3A.

A light-emitting device 140A illustrated in FIG. 4A includes a first pixel 101R that emits light of a first color, a second pixel 101G that emits light of a second color, a third pixel 101B that emits light of a third color, and a fourth pixel 101Y that emits light of a fourth color. The first pixel 101R includes a first light-emitting element 121R and a first optical element 156R overlapping with the first light-emitting element 121R, the second pixel 101G includes a second light-emitting element 121G and a second optical element 156G overlapping with the second light-emitting element 121G, the third pixel 101B includes a third light-emitting element 121B, and the fourth pixel 101Y includes a fourth light-emitting element 121Y.

The first light-emitting element 121R includes a first electrode 104, a first transparent conductive film 106R over the first electrode 104, a first light-emitting layer 110 over the first transparent conductive film 106R, a second light-emitting layer 112 over the first light-emitting layer 110, and a second electrode 114 over the second light-emitting layer 112. The second light-emitting element 121G includes the first electrode 104, a second transparent conductive film 106G over the first electrode 104, the first light-emitting layer 110 over the second transparent conductive film 106G, the second light-emitting layer 112 over the first light-emitting layer 110, and the second electrode 114 over the second light-emitting layer 112. The third light-emitting element 121B includes the first electrode 104, a third transparent conductive film 106B over the first electrode 104, the second light-emitting layer 112 over the third transparent conductive film 106B, and the second electrode 114 over the second light-emitting layer 112. The fourth light-emitting element 121Y includes the first electrode 104, a fourth transparent conductive film 106Y over the first electrode 104, the first light-emitting layer 110 over the fourth transparent conductive film 106Y, the second light-emitting layer 112 over the first light-emitting layer 110, and the second electrode 114 over the second light-emitting layer 112.

The light-emitting device 140A illustrated in FIG. 4A is different from the light-emitting device 140 illustrated in FIG. 3B in including the first light-emitting element 121R, the second light-emitting element 121G, the third light-emitting element 121B, and the fourth light-emitting element 121Y. Note that the first light-emitting element 121R, the second light-emitting element 121G, the third light-emitting element 121B, and the fourth light-emitting element 121Y have a microcavity structure. By employing the microcavity structure for the light-emitting elements, light of specific wavelengths can be efficiently extracted from light emitted from the light-emitting elements.

Light emitted from the first light-emitting layer 110 and the second light-emitting layer 112 resonates between the first electrode 104 and the second electrode 114. In the light-emitting device 140A, the thicknesses of the first transparent conductive film 106R, the second transparent conductive film 106G, the third transparent conductive film 106B, and the fourth transparent conductive film 106Y in the light-emitting elements are adjusted, so that the intensity of light emitted from the first light-emitting layer 110 and the second light-emitting layer 112 can be increased.

Specifically, the thicknesses of the first transparent conductive film 106R, the second transparent conductive film 106G, the third transparent conductive film 106B, and the fourth transparent conductive film 106Y are adjusted so that the optical length between the first electrode 104 and the second electrode 114 can be mλ/2 (m is a natural number), where λ is the wavelength of desired light. Furthermore, the thicknesses of the first transparent conductive film 106R, the second transparent conductive film 106G, the third transparent conductive film 106B, and the fourth transparent conductive film 106Y are adjusted so that the optical length between the first electrode 104 and the light-emitting layer (the first light-emitting layer 110 and the second light-emitting layer 112) can be (2m'+1)λ/4 (m' is a natural number), where X is the wavelength of desired light.

The thicknesses of the first transparent conductive film 106R, the second transparent conductive film 106G, the third transparent conductive film 106B, and the fourth transparent conductive film 106Y have the following relation: the first transparent conductive film 106R>the fourth transparent conductive film 106Y>the second transparent conductive film 106G>the third transparent conductive film 106B. In other words, the first transparent conductive film 106R includes a first region having a first thickness, the second transparent conductive film 106G includes a second region having a second thickness, the third transparent conductive film 106B includes a third region having a third thickness, and the fourth transparent conductive film 106Y includes a fourth region having a fourth thickness. The first thickness is larger than the fourth thickness, the fourth thickness is larger than the second thickness, and the second thickness is larger than the third thickness. For example, ITO films with thicknesses of 100 nm, 60 nm, 20 nm, and 80 nm are used as the first transparent conductive film 106R, the second transparent conductive film 106G, the third transparent conductive film 106B, and the fourth transparent conductive film 106Y, respectively. When the thicknesses of the first transparent conductive film 106R, the second transparent conductive film 106G, the third transparent conductive film 106B, and the fourth transparent conductive film 106Y satisfy the above relation, light of specific wavelengths can be efficiently extracted from light emitted from the light-emitting elements.

A light-emitting device 140B illustrated in FIG. 4B includes a first pixel 101R that emits light of a first color, a second pixel 101G that emits light of a second color, a third pixel 101B that emits light of a third color, and a fourth pixel 101Y that emits light of a fourth color. The first pixel 101R includes a first light-emitting element 122R and a first optical element 156R overlapping with the first light-emitting element 122R, the second pixel 101G includes a second light-emitting element 122G and a second optical element 156G overlapping with the second light-emitting element 122G, the third pixel 101B includes a third light-emitting element 122B, and the fourth pixel 101Y includes a fourth light-emitting element 122Y.

Furthermore, the first light-emitting element 122R, the second light-emitting element 122G, and the fourth light-emitting element 122Y each include a first electrode 104, a first transparent conductive film 106 over the first electrode 104, a hole-injection layer 131 over the first transparent conductive film 106, a hole-transport layer 132 over the hole-injection layer 131, a first light-emitting layer 110 over the hole-transport layer 132, a second light-emitting layer 112 over the first light-emitting layer 110, an electron-transport layer 133 over the second light-emitting layer 112, an electron-injection layer 134 over the electron-transport layer 133, and a second electrode 114 over the electron-injection layer 134. In addition, the third light-emitting element 122B includes the first electrode 104, the first transparent conductive film 106 over the first electrode 104, the hole-injection layer 131 over the first transparent conductive film 106, the hole-transport layer 132 over the hole-injection layer 131, the second light-emitting layer 112 over the hole-transport layer 132, the electron-transport layer 133 over the second light-emitting layer 112, the electron-injection layer 134 over the electron-transport layer 133, and the second electrode 114 over the electron-injection layer 134.

The light-emitting device 140B is different from the light-emitting device 140 illustrated in FIG. 3B in including the first light-emitting element 122R, the second light-emitting element 122G, and the third light-emitting element 122B.

The hole-injection layer 131, the hole-transport layer 132, the electron-transport layer 133, and the electron-injection layer 134 which are included in the first light-emitting element 122R, the second light-emitting element 122G, the third light-emitting element 122B, and the fourth light-emitting element 122Y are each shared among the light-emitting elements. In other words, for forming each of the hole-injection layer 131, the hole-transport layer 132, the electron-transport layer 133, and the electron-injection layer 134 in each light-emitting element, a plurality of steps are not necessary. Accordingly, in manufacturing the light-emitting elements of the light-emitting device 140B, the number of steps for forming a layer on selected pixels can be only one (the step for depositing the first light-emitting layer 110).

The hole-injection layer 131, the hole-transport layer 132, the electron-transport layer 133, and the electron-injection layer 134 included in the light-emitting device 140B can be formed with reference to the above description of the light-emitting device 100B.

The other structures are similar to those of the light-emitting device 140 illustrated in FIGS. 3A and 3B and have similar effects.

<Structural Example 5 of Light-Emitting Device>

Next, structure examples different from the light-emitting device 100 illustrated in FIGS. 1A and 1B will be described below with reference to FIGS. 5A and 5B and FIG. 6.

Figure 5A:
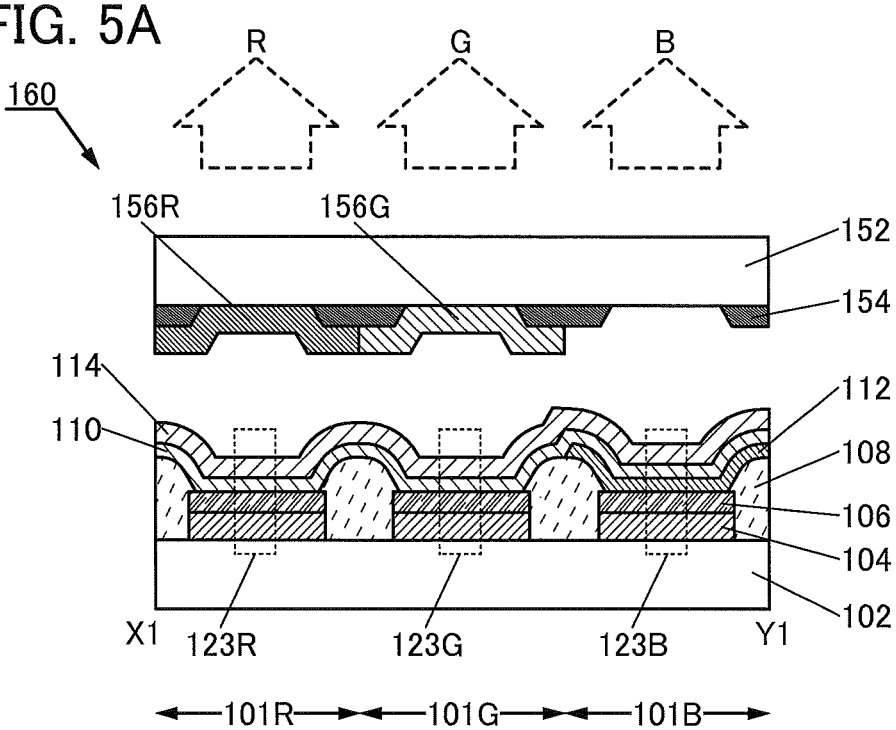
FIGS. 5A and 5B are each a cross-sectional view of a light-emitting device of one embodiment of the present invention.
Figure 5B:
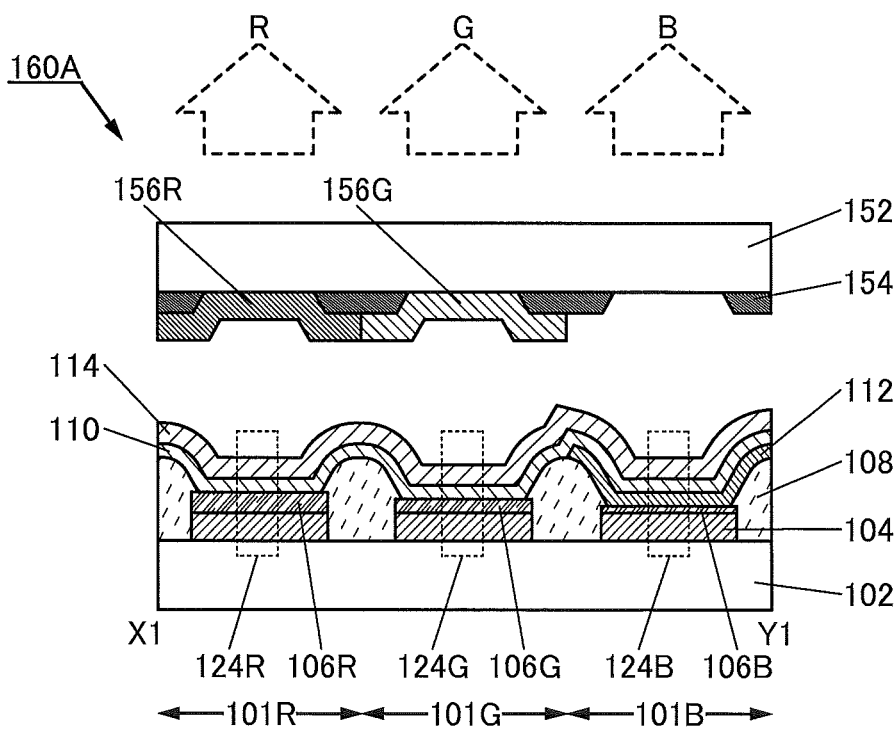
Figure 6:
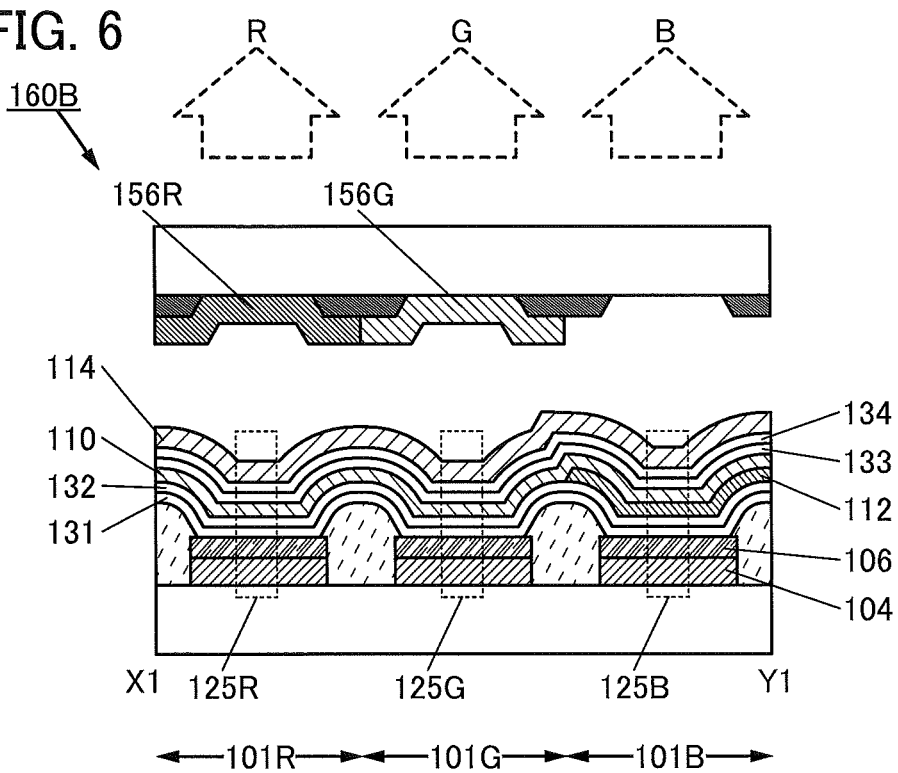
FIG. 6 is a cross-sectional view of a light-emitting device of one embodiment of the present invention.

FIGS. 5A and 5B and FIG. 6 are cross-sectional views each illustrating an example of the light-emitting device of embodiment of the present invention. Plan views of the light-emitting devices of FIGS. 5A and 5B and FIG. 6 are omitted here because they are similar to the plan view of the light-emitting device 100 illustrated in FIG. 1A.

A light-emitting device 160 illustrated in FIG. 5A includes a first pixel 101R that emits light of a first color, a second pixel 101G that emits light of a second color, and a third pixel 101B that emits light of a third color. The first pixel 101R includes a first light-emitting element 123R and a first optical element 156R overlapping with the first light-emitting element 123R, the second pixel 101G includes a second light-emitting element 123G and a second optical element 156G overlapping with the second light-emitting element 123G, and the third pixel 101B includes a third light-emitting element 123B.

The first light-emitting element 123R and the second light-emitting element 123G each include a first electrode 104, a first light-emitting layer 110 over the first electrode 104, and a second electrode 114 over the first light-emitting layer 110. The third light-emitting element 123B includes the first electrode 104, a second light-emitting layer 112 over the first electrode 104, the first light-emitting layer 110 over the second light-emitting layer 112, and the second electrode 114 over the first light-emitting layer 110. As illustrated in FIG. 5A, a transparent conductive film 106 may be provided over the first electrode 104.

Thus, in the light-emitting device 160 illustrated in FIG. 5A, the first light-emitting layer 110 is shared among the first light-emitting element 123R, the second light-emitting element 123G, and the third light-emitting element 123B, and the second light-emitting layer 112 is used in the third light-emitting element 123B. By sharing the first light-emitting layer 110 among the light-emitting elements, the productivity in formation of the light-emitting elements can be increased. Specifically, in manufacturing the light-emitting elements of the light-emitting device 160, the number of steps for forming a layer on selected pixels can be only one (the step for depositing the second light-emitting layer 112), so that the productivity can be increased.

The first pixel 101R emits red (R) light, the second pixel 101G emits green (G) light, and the third pixel 101B emits blue (B) light. Accordingly, by the first pixel 101R, the second pixel 101G, and the third pixel 101B, full-color display can be performed.

Yellow light is emitted from the first light-emitting element 123R included in the first pixel 101R, and the yellow light passes through the first optical element 156R to be converted into red light. This red light is emitted to the outside. Furthermore, yellow light is emitted from the second light-emitting element 123G included in the second pixel 101G, and the yellow light passes through the second optical element 156G to be converted into green light. This green light is emitted to the outside. The third light-emitting element 123B included in the third pixel 101B emits blue light, and the blue light is emitted to the outside as it is without passing through any optical element or the like. In other words, the third pixel 101B does not include an optical element. Accordingly, in this structure, light emitted from the third light-emitting element 123B is extracted to the outside without passing through any optical element. In other words, the light emitted from the third light-emitting element 123B is emitted with smaller loss than that of light emitted from the first light-emitting element 123R and the second light-emitting element 123G. Thus, power consumption of the light-emitting device 160 can be low. In the third light-emitting element 123B, the first light-emitting layer 110 does not contribute to light emission.

A light-emitting device 160A illustrated in FIG. 5B includes a first pixel 101R that emits light of a first color, a second pixel 101 G that emits light of a second color, and a third pixel 101B that emits light of a third color. The first pixel 101R includes a first light-emitting element 124R and a first optical element 156R overlapping with the first light-emitting element 124R, the second pixel 101G includes a second light-emitting element 124G and a second optical element 156G overlapping with the second light-emitting element 124G, and the third pixel 101B includes a third light-emitting element 124B.

The first light-emitting element 124R includes a first electrode 104, a first transparent conductive film 106R over the first electrode 104, a first light-emitting layer 110 over the first transparent conductive film 106R, and a second electrode 114 over the first light-emitting layer 110. The second light-emitting element 124G includes the first electrode 104, a second transparent conductive film 106G over the first electrode 104, the first light-emitting layer 110 over the second transparent conductive film 106G, and the second electrode 114 over the first light-emitting layer 110. The third light-emitting element 124B includes the first electrode 104, a third transparent conductive film 106B over the first electrode 104, a second light-emitting layer 112 over the third transparent conductive film 106B, the first light-emitting layer 110 over the second light-emitting layer 112, and the second electrode 114 over the first light-emitting layer 110.

Note that the first light-emitting element 124R, the second light-emitting element 124G, and the third light-emitting element 124B have a microcavity structure.

The first transparent conductive film 106R, the second transparent conductive film 106G, and the third transparent conductive film 106B included in the first light-emitting element 124R, the second light-emitting element 124G, and the third light-emitting element 124B can have structures similar to those of the transparent conductive films 106 in the light-emitting device 100.

The other structures are similar to those of the light-emitting device 160 and have similar effects.

A light-emitting device 160B illustrated in FIG. 6 includes a first pixel 101R that emits light of a first color, a second pixel 101G that emits light of a second color, and a third pixel 101B that emits light of a third color. The first pixel 101R includes a first light-emitting element 125R and a first optical element 156R overlapping with the first light-emitting element 125R, the second pixel 101G includes a second light-emitting element 125G and a second optical element 156G overlapping with the second light-emitting element 125G, and the third pixel 101B includes a third light-emitting element 125B.

Furthermore, the first light-emitting element 125R and the second light-emitting element 125G each include a first electrode 104, a transparent conductive film 106 over the first electrode 104, a hole-injection layer 131 over the transparent conductive film 106, a hole-transport layer 132 over the hole-injection layer 131, a first light-emitting layer 110 over the hole-transport layer 132, an electron-transport layer 133 over the first light-emitting layer 110, an electron-injection layer 134 over the electron-transport layer 133, and a second electrode 114 over the electron-injection layer 134.

In addition, the third light-emitting element 125B includes the first electrode 104, the transparent conductive film 106 over the first electrode 104, the hole-injection layer 131 over the transparent conductive film 106, the hole-transport layer 132 over the hole-injection layer 131, the second light-emitting layer 112 over the hole-transport layer 132, the electron-transport layer 133 over the second light-emitting layer 112, the electron-injection layer 134 over the electron-transport layer 133, and the second electrode 114 over the electron-injection layer 134.

The hole-injection layer 131, the hole-transport layer 132, the electron-transport layer 133, and the electron-injection layer 134 included in the light-emitting device 160B illustrated in FIG. 6 can be formed with reference to the above description of the light-emitting device 100B.

The hole-injection layer 131, the hole-transport layer 132, the electron-transport layer 133, and the electron-injection layer 134 which are included in the first light-emitting element 125R, the second light-emitting element 125G, and the third light-emitting element 125B are each shared among the light-emitting elements. In other words, for forming each of the hole-injection layer 131, the hole-transport layer 132, the electron-transport layer 133, and the electron-injection layer 134 in each light-emitting element, a plurality of steps are not necessary. Accordingly, in manufacturing the light-emitting elements of the light-emitting device 160B, the number of steps for forming a layer on selected pixels can be only one (the step for depositing the second light-emitting layer 112).

The other structures are similar to those of the light-emitting device 160 and have similar effects.

<Structural Example 6 of Light-Emitting Device>

Next, structure examples different from the light-emitting device 140 illustrated in FIGS. 3A and 3B will be described below with reference to FIGS. 7A and 7B, FIGS. 8A and 8B, and FIG. 9.

Figure 7A:
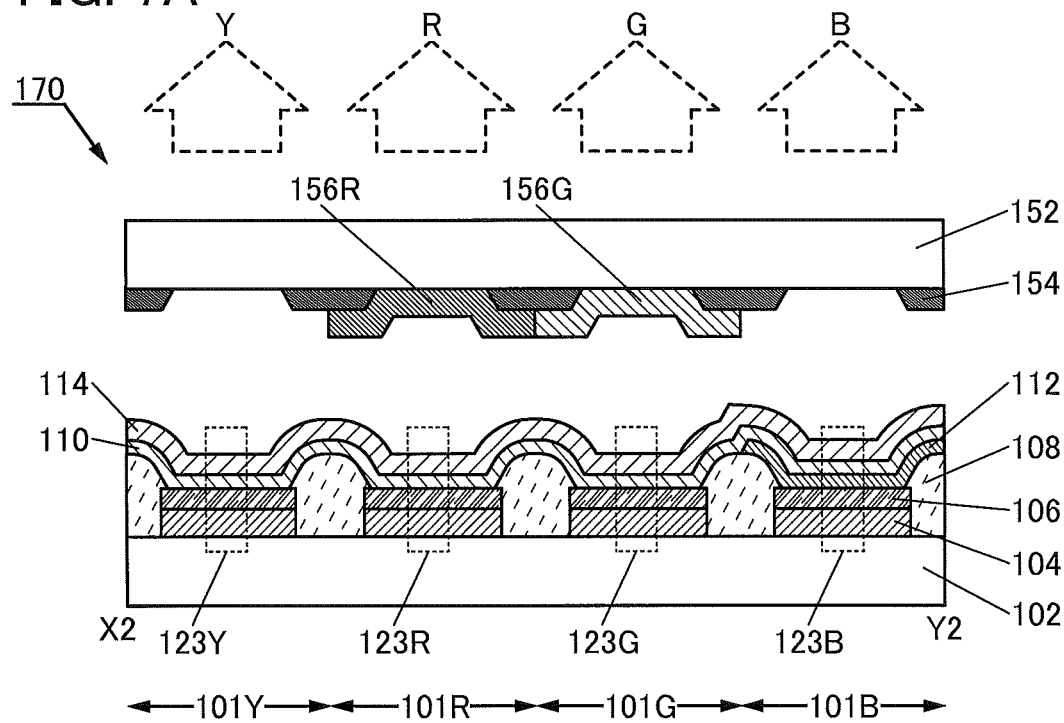
FIGS. 7A and 7B are each a cross-sectional view of a light-emitting device of one embodiment of the present invention.

A light-emitting device 170 illustrated in FIG. 7A includes a first pixel 101R that emits light of a first color, a second pixel 101G that emits light of a second color, a third pixel 101B that emits light of a third color, and a fourth pixel 101Y that emits light of a fourth color. The first pixel 101R includes a first light-emitting element 123R and a first optical element 156R overlapping with the first light-emitting element 123R, the second pixel 101G includes a second light-emitting element 123G and a second optical element 156G overlapping with the second light-emitting element 123G, the third pixel 101B includes a third light-emitting element 123B, and the fourth pixel 101Y includes a fourth light-emitting element 123Y.

The first light-emitting element 123R, the second light-emitting element 123G, and the fourth light-emitting element 123Y each include a first electrode 104, a first light-emitting layer 110 over the first electrode 104, and a second electrode 114 over the first light-emitting layer 110. The third light-emitting element 123B includes the first electrode 104, a second light-emitting layer 112 over the first electrode 104, the first light-emitting layer 110 over the second light-emitting layer 112, and the second electrode 114 over the first light-emitting layer 110.

Thus, in the light-emitting device 170, the first light-emitting layer 110 is shared among the first light-emitting element 123R, the second light-emitting element 123G, and the third light-emitting element 123B, and the second light-emitting layer 112 is used in the third light-emitting element 123B. By sharing the first light-emitting layer 110 among the light-emitting elements, the productivity in formation of the light-emitting elements can be increased. Specifically, in manufacturing the light-emitting elements of the light-emitting device 170, the number of steps for forming a layer on selected pixels can be only one (the step for depositing the second light-emitting layer 112).

The first pixel 101R emits red (R) light, the second pixel 101G emits green (G) light, the third pixel 101B emits blue (B) light, and the fourth pixel 101Y emits yellow (Y) light.

Since the light-emitting device 170 includes the fourth pixel 101Y in addition to the first pixel 101R, the second pixel 101G, and the third pixel 101B, color reproducibility can be increased. By including the fourth pixel 101Y, the light-emitting device 170 can have reduced power consumption.

Yellow light is emitted from the first light-emitting element 123R included in the first pixel 101R, and the yellow light passes through the first optical element 156R to be converted into red light. This red light is emitted to the outside. Furthermore, yellow light is emitted from the second light-emitting element 123G included in the second pixel 101G, and the yellow light passes through the second optical element 156G to be converted into green light. This green light is emitted to the outside. The third light-emitting element 123B included in the third pixel 101B emits blue light, and the blue light is emitted to the outside as it is without passing through any optical element or the like. The fourth light-emitting element 123Y emits yellow light, and the yellow light is emitted to the outside as it is without passing through any optical element or the like. In other words, the third pixel 101B and the fourth pixel 101Y do not include an optical element. Accordingly, in this structure, light emitted from the third light-emitting element 123B and the fourth light-emitting element 123Y is extracted to the outside without passing through any optical element. In other words, the light emitted from the third light-emitting element 123B and the fourth light-emitting element 123Y is emitted with smaller loss than that of light emitted from the first light-emitting element 123R and the second light-emitting element 123G. Thus, power consumption of the light-emitting device 170 can be low. In the third light-emitting element 123B, the first light-emitting layer 110 does not contribute to light emission.

Figure 7B:
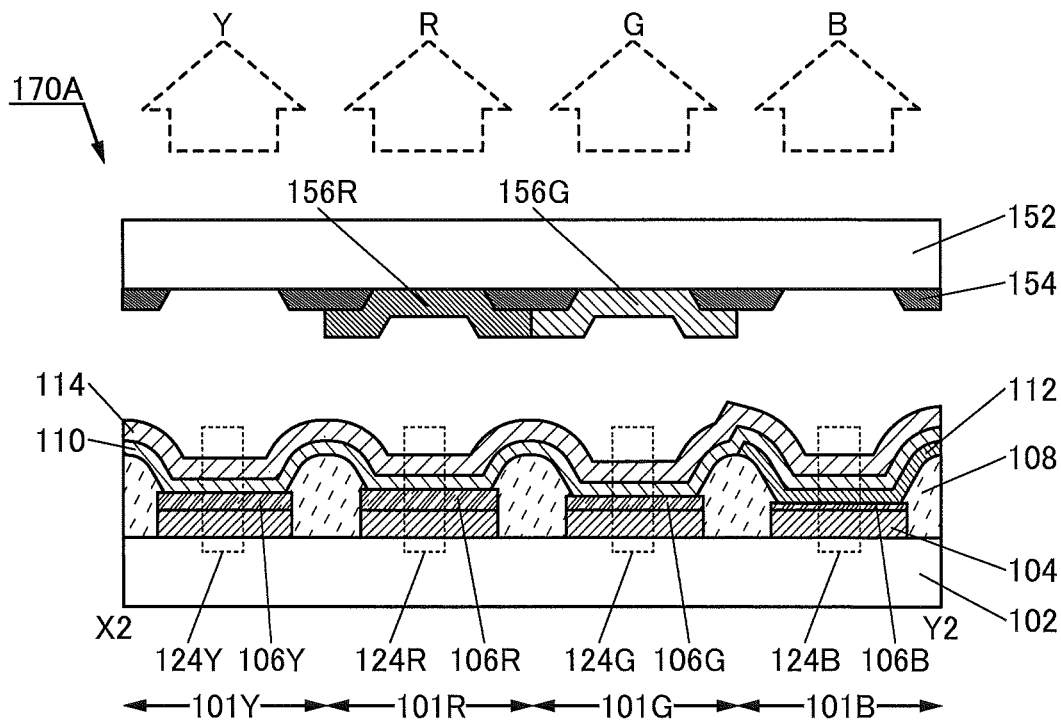

A light-emitting device 170A illustrated in FIG. 7B includes a first pixel 101R that emits light of a first color, a second pixel 101G that emits light of a second color, a third pixel 101B that emits light of a third color, and a fourth pixel 101Y that emits light of a fourth color. The first pixel 101R includes a first light-emitting element 124R and a first optical element 156R overlapping with the first light-emitting element 124R, the second pixel 101G includes a second light-emitting element 124G and a second optical element 156G overlapping with the second light-emitting element 124G, the third pixel 101B includes a third light-emitting element 124B, and the fourth pixel 101Y includes a fourth light-emitting element 124Y.

The first light-emitting element 124R includes a first electrode 104, a first transparent conductive film 106R over the first electrode 104, a first light-emitting layer 110 over the first transparent conductive film 106R, and a second electrode 114 over the first light-emitting layer 110. The second light-emitting element 124G includes the first electrode 104, a second transparent conductive film 106G over the first electrode 104, the first light-emitting layer 110 over the second transparent conductive film 106G, and the second electrode 114 over the first light-emitting layer 110. The third light-emitting element 124B includes the first electrode 104, a third transparent conductive film 106B over the first electrode 104, a second light-emitting layer 112 over the third transparent conductive film 106B, the first light-emitting layer 110 over the second light-emitting layer 112, and the second electrode 114 over the first light-emitting layer 110. The fourth light-emitting element 124Y includes the first electrode 104, a fourth transparent conductive film 106Y over the first electrode 104, the first light-emitting layer 110 over the fourth transparent conductive film 106Y, and the second electrode 114 over the first light-emitting layer 110.

Note that the first light-emitting element 124R, the second light-emitting element 124G, the third light-emitting element 124B, and the fourth light-emitting element 124Y have a microcavity structure. By employing the microcavity structure for the light-emitting elements, light of specific wavelengths can be efficiently extracted from light emitted from the light-emitting elements.

The first transparent conductive film 106R, the second transparent conductive film 106G, the third transparent conductive film 106B, and the fourth transparent conductive film 106Y included in the first light-emitting element 124R, the second light-emitting element 124G, the third light-emitting element 124B, and the fourth light-emitting element 124Y can have structures similar to those of the transparent conductive films 106 in the light-emitting device 140 described in the above embodiment.

Figure 8A:
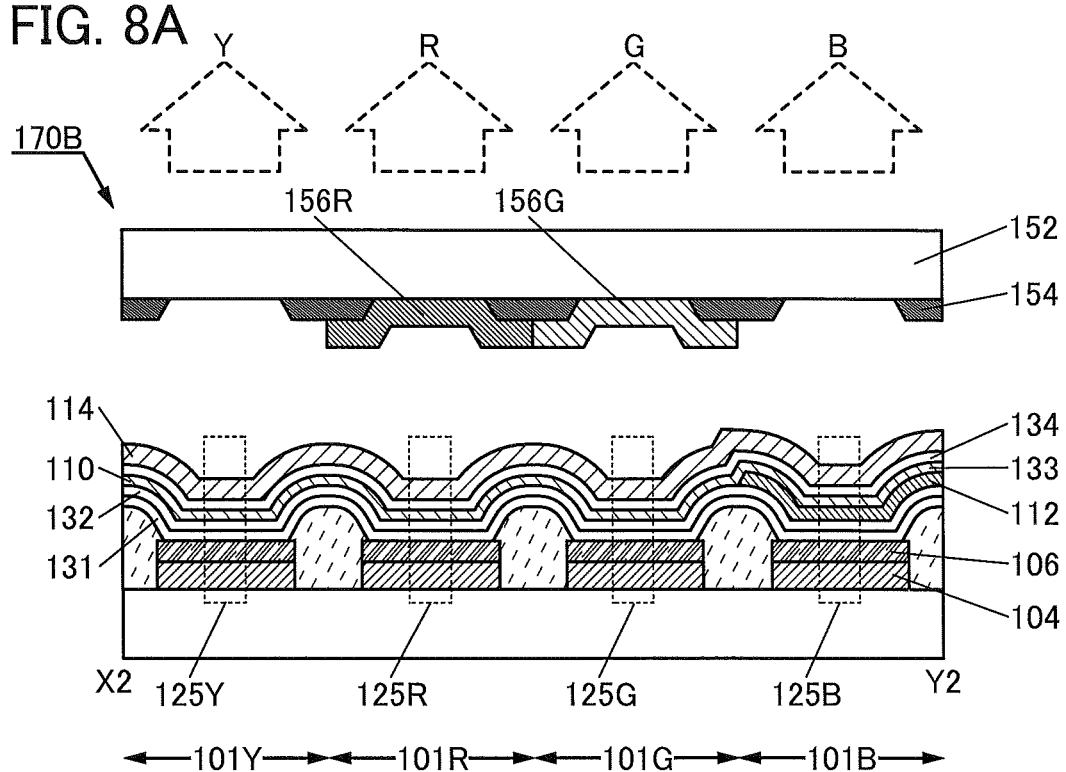
FIGS. 8A and 8B are each a cross-sectional view of a light-emitting device of one embodiment of the present invention.

A light-emitting device 170B illustrated in FIG. 8A includes a first pixel 101R that emits light of a first color, a second pixel 101G that emits light of a second color, a third pixel 101B that emits light of a third color, and a fourth pixel 101Y that emits light of a fourth color. The first pixel 101R includes a first light-emitting element 125R and a first optical element 156R overlapping with the first light-emitting element 125R, the second pixel 101G includes a second light-emitting element 125G and a second optical element 156G overlapping with the second light-emitting element 125G, the third pixel 101B includes a third light-emitting element 125B, and the fourth pixel 101Y includes a fourth light-emitting element 125Y.

Furthermore, the first light-emitting element 125R, the second light-emitting element 125G, and the fourth light-emitting element 125Y each include a first electrode 104, a transparent conductive film 106 over the first electrode 104, a hole-injection layer 131 over the transparent conductive film 106, a hole-transport layer 132 over the hole-injection layer 131, a first light-emitting layer 110 over the hole-transport layer 132, an electron-transport layer 133 over the first light-emitting layer 110, an electron-injection layer 134 over the electron-transport layer 133, and a second electrode 114 over the electron-injection layer 134. In addition, the third light-emitting element 125B includes the first electrode 104, the transparent conductive film 106 over the first electrode 104, the hole-injection layer 131 over the transparent conductive film 106, the hole-transport layer 132 over the hole-injection layer 131, the second light-emitting layer 112 over the hole-transport layer 132, the electron-transport layer 133 over the second light-emitting layer 112, the electron-injection layer 134 over the electron-transport layer 133, and the second electrode 114 over the electron-injection layer 134.

The hole-injection layer 131, the hole-transport layer 132, the electron-transport layer 133, and the electron-injection layer 134 included in the light-emitting device 170B illustrated in FIG. 8A can be formed with reference to the above description of the light-emitting device 140B.

The other structures are similar to those of the light-emitting device 170 and have similar effects.

Figure 8B:
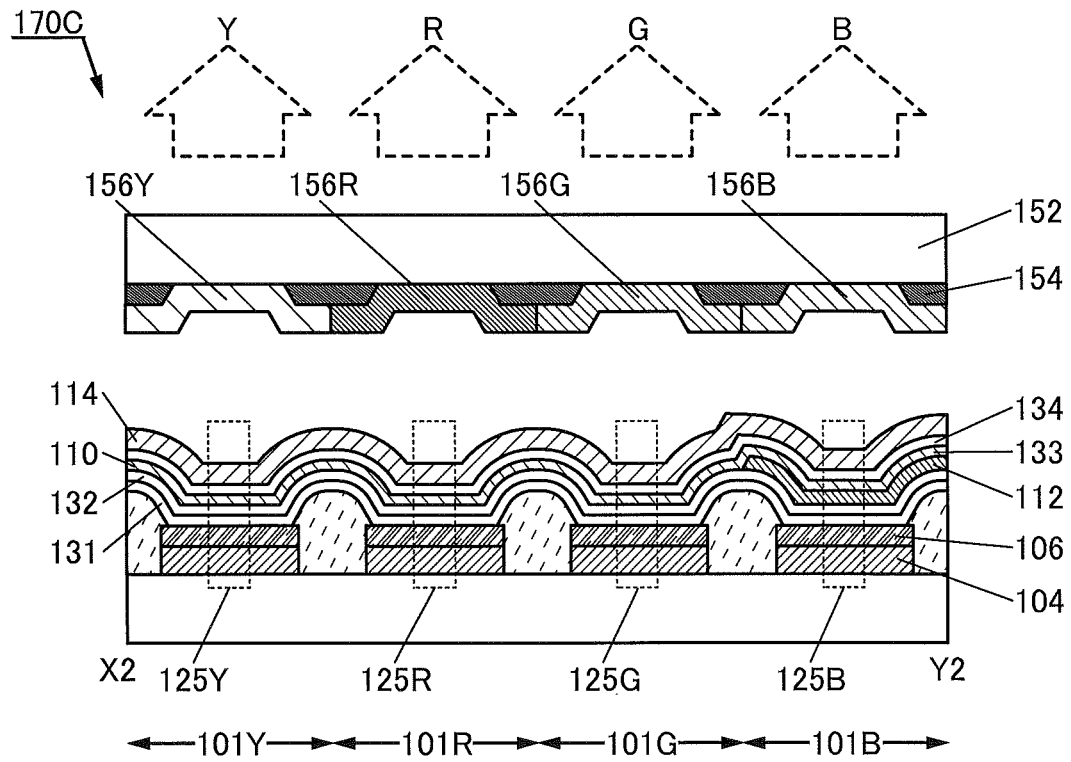

A light-emitting device 170C illustrated in FIG. 8B is an example having an optical element structure different from the light-emitting device 170B illustrated in FIG. 8A. Specifically, the third pixel 101B and fourth pixel 101Y included in the light-emitting device 170C include a third optical element 156B and a fourth optical element 156Y, respectively.

The third optical element 156B and the fourth optical element 156Y can have structures similar to those of the first optical element 156R and the second optical element 156G described above. The third optical element 156B transmits blue light out of light emitted from the third light-emitting element 125B. In addition, the fourth optical element 156Y transmits yellow light out of light emitted from the fourth light-emitting element 125Y.

In this manner, by providing an optical element above each light-emitting element, color purity can be improved. Moreover, reflection of external light can be reduced.

Figure 9:
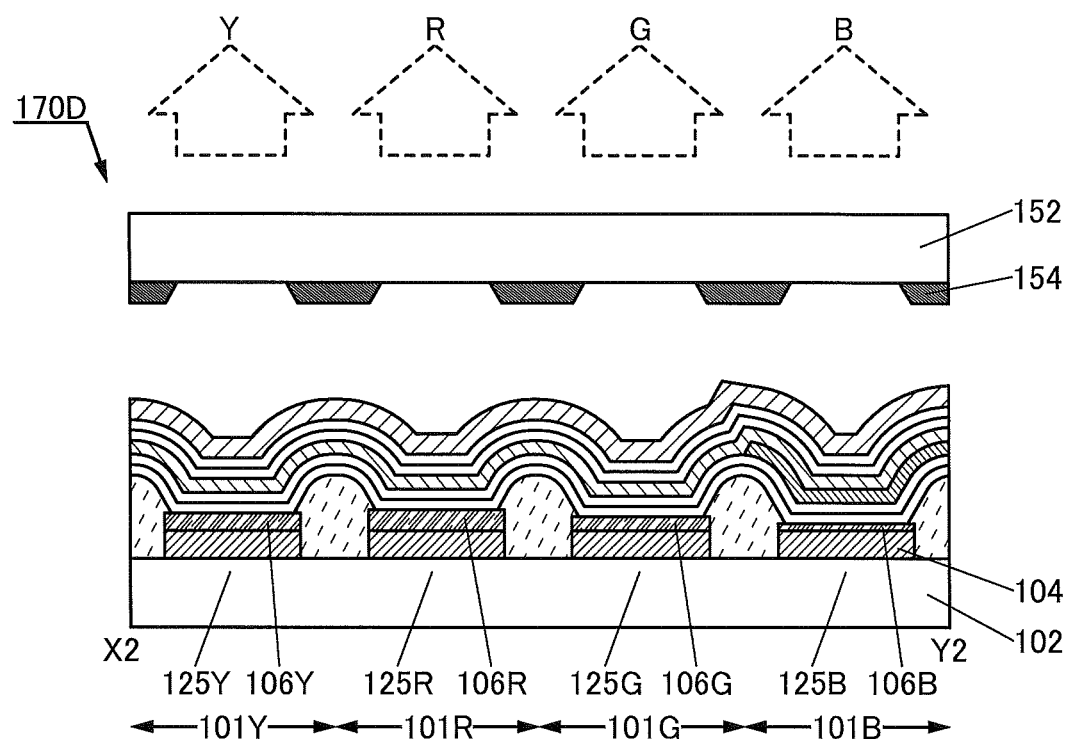
FIG. 9 is a cross-sectional view of a light-emitting device of one embodiment of the present invention.
Figure 10A:
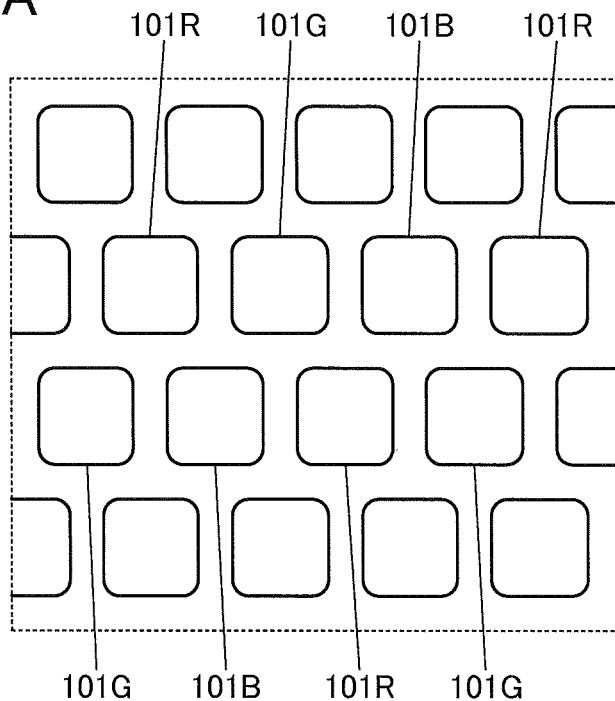
FIGS. 10A and 10B are each a plan view of a light-emitting device of one embodiment of the present invention.
Figure 10B:
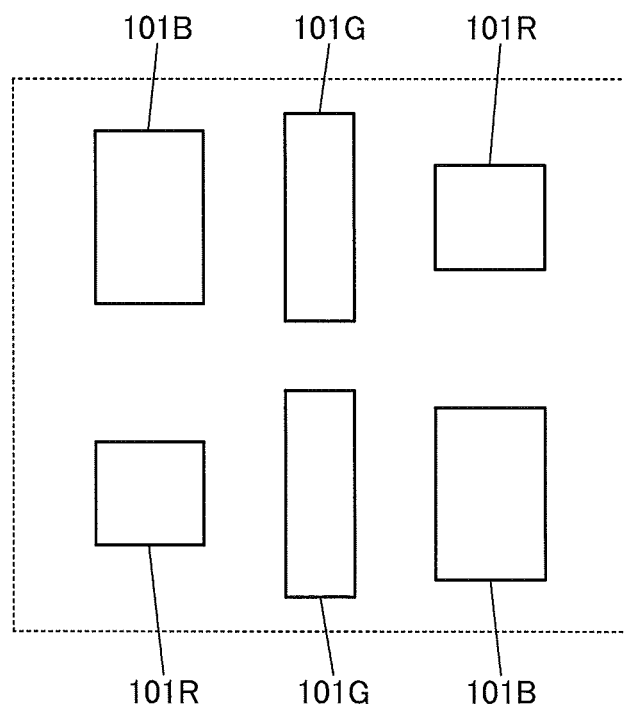

A light-emitting device 170D illustrated in FIG. 9 is an example having an optical element structure different from the light-emitting device 170B illustrated in FIG. 8A. Specifically, the first pixel 101R, the second pixel 101G, the third pixel 101B, and the fourth pixel 101Y included in the light-emitting device 170D do not include an optical element.

With this structure where optical elements are not provided above any of the light-emitting elements, power consumption can be reduced. Note that in the case where the light-emitting elements have the microcavity structure as in the light-emitting device 170D, in which light of specific wavelengths is efficiently extracted from light emitted from the light-emitting elements, the spectrum of light emitted from the light-emitting elements might be perceived different depending on the viewing angle (this phenomenon is referred to as "viewing angle dependence"). In the case where the viewing angle dependence is large, by providing optical elements above the light-emitting elements as in the light-emitting device 170C, the viewing angle dependence can be prevented.

The above-described structures of the light-emitting devices can be combined as appropriate.

<Manufacturing Method 1 of Light-emitting Device>

Next, a manufacturing method of a light-emitting device of one embodiment of the present invention will be described below with reference to FIGS. 11A to 11D and FIGS. 12A and 12B. Here, a manufacturing method of the light-emitting device 140 illustrated in FIGS. 3A and 3B will be described.

FIGS. 11A to 11D and FIGS. 12A and 12B are cross-sectional views for explaining the manufacturing method of the light-emitting device of one embodiment of the present invention.

The manufacturing method of the light-emitting device 140 described below includes first to sixth steps.

<First Step>

Figure 11A:
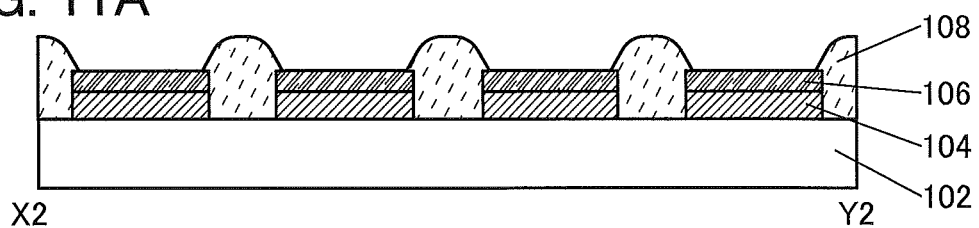
FIGS. 11A to 11D are cross-sectional views illustrating a method for manufacturing a light-emitting device of one embodiment of the present invention.

The first step is a step for forming the lower electrode (specifically, the first electrode 104 and the transparent conductive film 106) of each light-emitting element and the partition 108 over the substrate 102 where any light-emitting layer containing an organic compound has not been formed (see FIG. 11A).

In the first step, since there is no possibility of damaging a light-emitting layer containing an organic compound, a variety of micromachining technologies can be employed. In this embodiment, conductive films to be the first electrode 104 and the transparent conductive film 106 are formed by a sputtering method, subjected to patterning by a photolithography technique, and then processed into an island shape by a dry etching method or a wet etching method to form the lower electrode. Then, the partition 108 is formed to cover an end portion of the island-shaped lower electrode.

In the first step, the reflective conductive film is formed over the substrate 102, and then the transparent conductive film is formed. In this embodiment, a film of an alloy containing silver, palladium, and copper is used as the reflective conductive film, and an ITO film is used as the transparent conductive film.

Note that a transistor may be formed over the substrate 102 before the first step. This transistor and the first electrode 104 may be electrically connected to each other.

The transparent conductive film may be formed in a plurality of steps. In this way, the transparent conductive film having an appropriate thickness for the microcavity structure of each light-emitting element can be formed.

The partition 108 includes an opening overlapping with the lower electrode. The transparent conductive film exposed by the opening functions as the lower electrode of the light-emitting element. In this embodiment, an acrylic resin is used as the partition 108.

<Second Step>

Figure 11B:
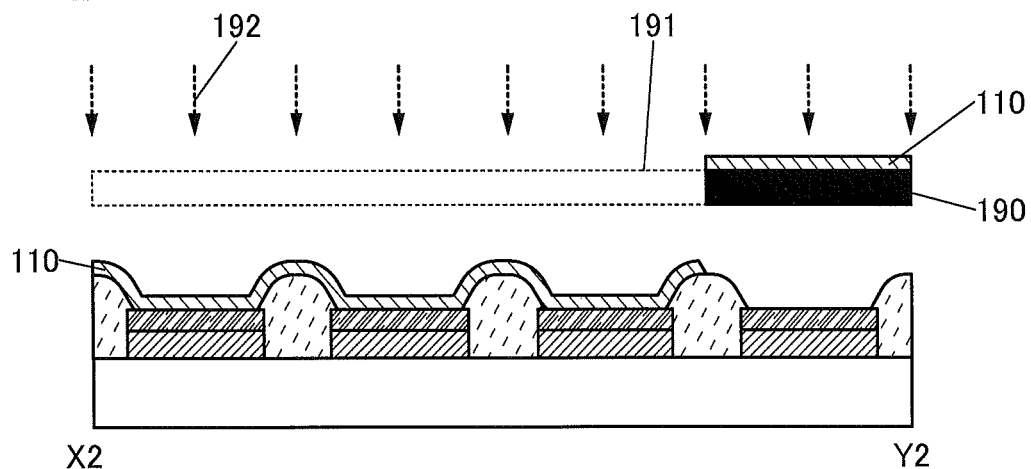

The second step is a step for forming the first light-emitting layer 110 with a shadow mask 190 (see FIG. 11B).

In the second step, the shadow mask 190 having an opening 191 is provided so as to overlap the transparent conductive film 106 and the partition 108, and an organic compound 192 including the first light-emitting material is vapor-deposited through the shadow mask 190, so that the first light-emitting layer 110 is formed.

In this embodiment, the substrate 102 is provided in an evaporation apparatus, and the shadow mask 190 is provided on the evaporation source (not shown) side. Next, alignment for providing the opening 191 of the shadow mask 190 in a desired position is performed. Note that the shadow mask 190 is a shielding plate provided with the opening 191 and formed of foil of a metal or the like with a thickness of more than or equal to several tens of micrometers or a plate of a metal or the like with a thickness of less than or equal to several hundreds of micrometers.

The first light-emitting layer 110 includes the first light-emitting material having a spectrum peak in the range of higher than or equal to 540 nm and lower than or equal to 580 nm. As the first light-emitting material, a phosphorescent organic compound emitting yellow light can be used. The phosphorescent organic compound may be vapor-deposited alone or the phosphorescent organic compound mixed with another material may be vapor-deposited. For example, the phosphorescent organic compound may be used as a guest material, and the guest material may be dispersed into a host material having higher excitation energy than the guest material.

Note that before the first light-emitting layer 110 is formed, an organic compound (e.g., a hole-injection layer and/or a hole-transport layer) shared among the first light-emitting element 120R, the second light-emitting element 120G, the third light-emitting element 120B, and the fourth light-emitting element 120Y may be framed over the transparent conductive film 106.

<Third Step>

Figure 11C:
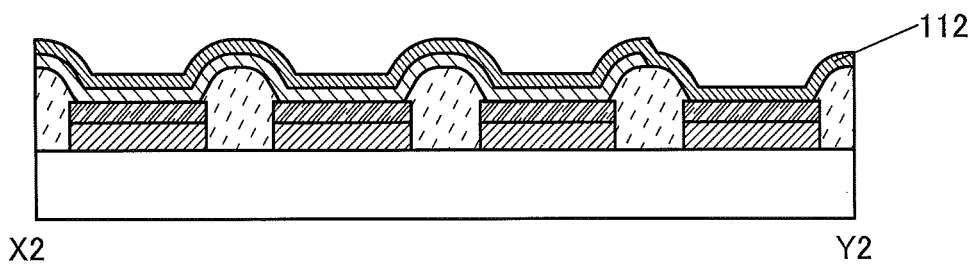

The third step is a step for forming the second light-emitting layer 112 over the lower electrode (the transparent conductive film 106), the partition 108, and the first light-emitting layer 110 (see FIG. 11C).

The second light-emitting layer 112 includes the second light-emitting material having a spectrum peak in the range of higher than or equal to 420 nm and lower than or equal to 480 nm. As the second light-emitting material, a fluorescent organic compound emitting blue light can be used. The fluorescent organic compound may be vapor-deposited alone or the fluorescent organic compound mixed with another material may be vapor-deposited. For example, the fluorescent organic compound may be used as a guest material, and the guest material may be dispersed into a host material having higher excitation energy than the guest material.

<Fourth Step>

Figure 11D:
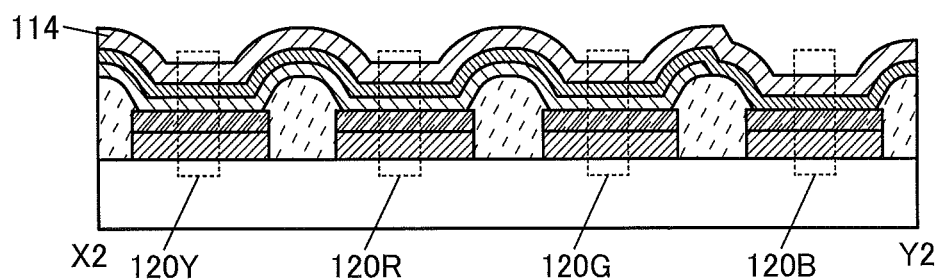

The fourth step is a step for forming the second electrode 114 having a function of the upper electrode of the light-emitting element over the second light-emitting layer 112 (see FIG. 11D).

Note that before the second electrode 114 is formed, an organic compound (e.g., an electron-transport layer and/or an electron-injection layer) shared among the first light-emitting element 120R, the second light-emitting element 120G, the third light-emitting element 120B, and the fourth light-emitting element 120Y may be formed over the second light-emitting layer 112.

Through the above-described steps, the first light-emitting element 120R, the second light-emitting element 120G, the third light-emitting element 120B, and the fourth light-emitting element 120Y are formed over the substrate 102.

<Fifth Step>

Figure 12A:
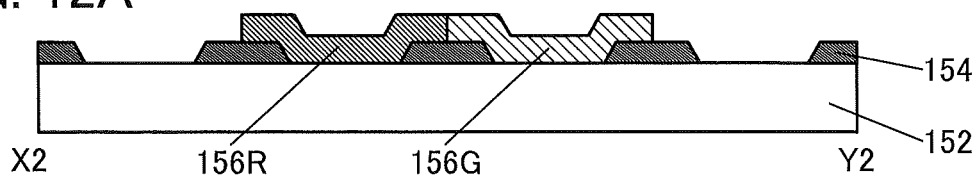
FIGS. 12A and 12B are cross-sectional views illustrating the method for manufacturing a light-emitting device of one embodiment of the present invention.

The fifth step is a step for forming the light-blocking layer 154, the first optical element 156R, and the second optical element 156G over the substrate 152 (see FIG. 12A).

In this embodiment, as the light-blocking layer 154, an organic resin film containing black pigment is formed in a desired region. Then, the first optical element 156R and the second optical element 156G are formed over the substrate 152 and the light-blocking layer 154. As the first optical element 156R, an organic resin film containing red pigment is formed in a desired region. As the second optical element 156G, an organic resin film containing green pigment is formed in a desired region.

<Sixth Step>

Figure 12B:
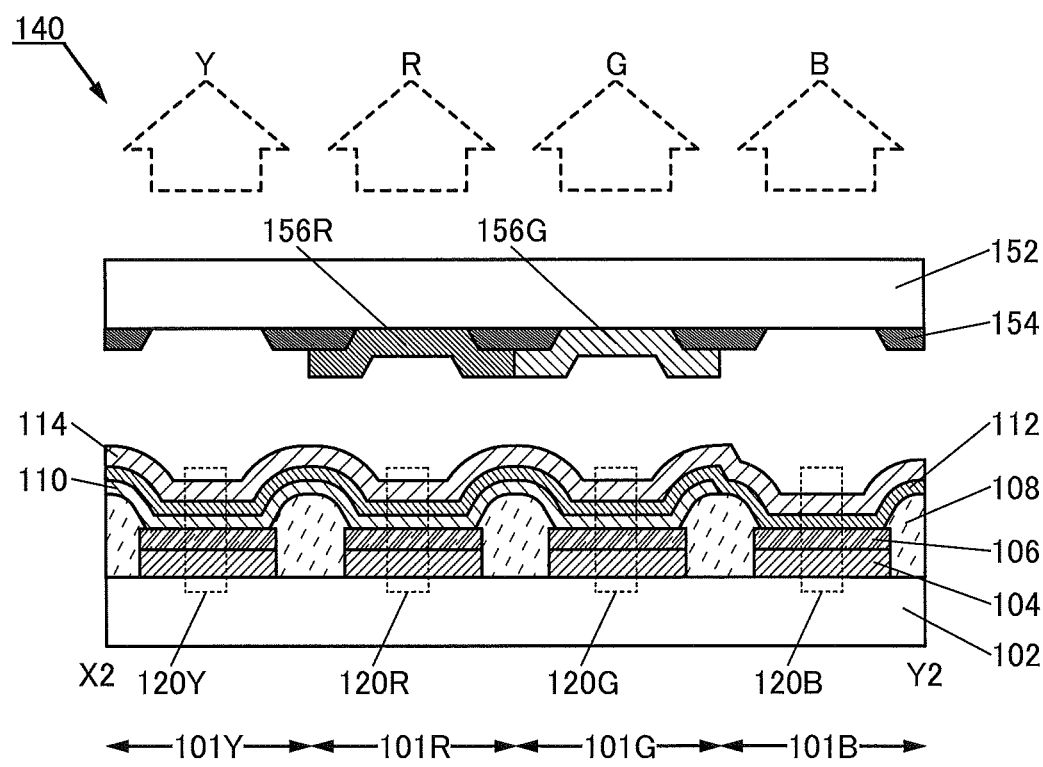

The sixth step is a step for attaching the first light-emitting element 120R, the second light-emitting element 120G, the third light-emitting element 120B, and the fourth light-emitting element 120Y formed over the substrate 102 to the light-blocking layer 154, the first optical element 156R, and the second optical element 156G formed over the substrate 152 and performing sealing with a sealant (not shown) (see FIG. 12B).

Through the above-described steps, the light-emitting device 140 illustrated in FIG. 3B can be formed. In this embodiment, in manufacturing the light-emitting elements, the number of steps for forming a layer on selected pixels can be only one (the step for depositing the first light-emitting layer 110); thus, a manufacturing method of a light-emitting device with high productivity can be provided. Consequently, a manufacturing method of a novel light-emitting device in which a decrease in aperture ratio accompanied by fabrication of a high-definition device is suppressed can be provided. Furthermore, a novel light-emitting device which can be produced easily can be provided.

<Manufacturing Method 2 of Light-Emitting Device>

Next, a manufacturing method of a light-emitting device of one embodiment of the present invention will be described below with reference to FIGS. 13A to 13D.

Here, a manufacturing method of the light-emitting device 170 illustrated in FIG. 7A will be described.

FIGS. 13A to 13D are cross-sectional views for explaining the manufacturing method of the light-emitting device of one embodiment of the present invention.

The manufacturing method of the light-emitting device 170 described below includes first to sixth steps.

<First Step>

Figure 13A:
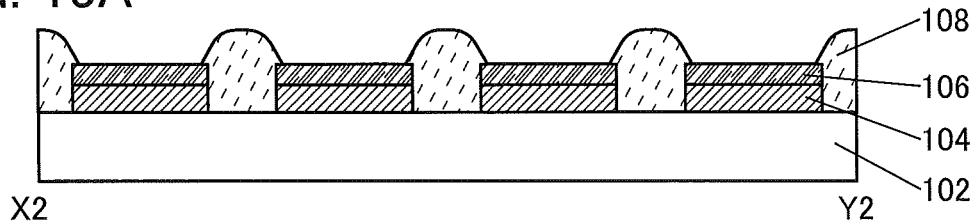
FIGS. 13A to 13D are cross-sectional views illustrating a method for manufacturing a light-emitting device of one embodiment of the present invention.

The first step is a step for forming the lower electrode (specifically, the first electrode 104 and the transparent conductive film 106) of each light-emitting element and the partition 108 over the substrate 102 where any light-emitting layer containing an organic compound has not been formed (see FIG. 13A).

This first step is not described in detail here because it is similar to the above-described first step of the light-emitting device 140.

<Second Step>

Figure 13B:
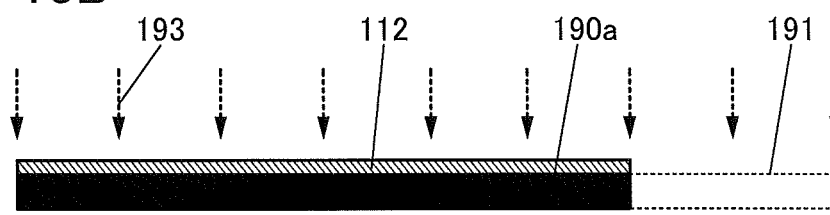

The second step is a step for forming the second light-emitting layer 112 with a shadow mask 190a (see FIG. 13B).

In the second step, the shadow mask 190a having an opening 191 is provided so as to overlap the transparent conductive film 106 and the partition 108, and an organic compound 193 including the second light-emitting material is vapor-deposited through the shadow mask 190a, so that the second light-emitting layer 112 is formed.

In this embodiment, the substrate 102 is provided in an evaporation apparatus, and the shadow mask 190a is provided on the evaporation source (not shown) side. Next, alignment for providing the opening 191 of the shadow mask 190a in a desired position is performed. Note that the shadow mask 190a is a shielding plate provided with the opening 191 and formed of foil of a metal or the like with a thickness of more than or equal to several tens of micrometers or a plate of a metal or the like with a thickness of less than or equal to several hundreds of micrometers.

Note that the area of the opening 191 in the shadow mask 190a is smaller than that of the opening 191 in the shadow mask 190 described above. When the area of the opening 191 is small, the mechanical strength of the shadow mask 190a is increased, and owing to a decrease in bending or the like of the shadow mask 190a, the alignment accuracy is improved, which is preferable.

The second light-emitting layer 112 includes the second light-emitting material having a spectrum peak in the range of higher than or equal to 420 nm and lower than or equal to 480 nm. As the second light-emitting material, a fluorescent organic compound emitting blue light can be used. The fluorescent organic compound may be evaporated alone or together with another material. For example, the fluorescent organic compound may be used as a guest material, and the guest material may be dispersed into a host material having a higher excitation energy than the guest material.

Note that before the second light-emitting layer 112 is formed, an organic compound (e.g., a hole injection layer and/or a hole-transport layer) shared among the first light-emitting element 123R, the second light-emitting element 123G, the third light-emitting element 123B, and the fourth light-emitting element 123Y may be formed over the transparent conductive film 106.

<Third Step>

Figure 13C:
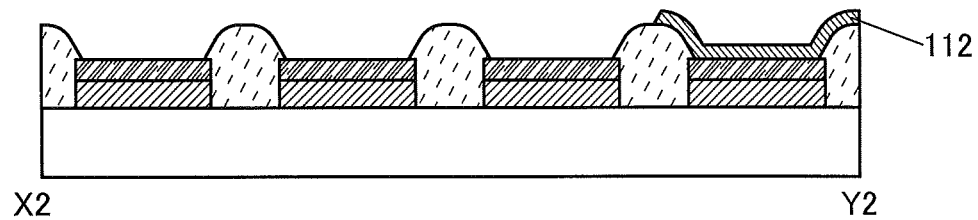

The third step is a step for forming the first light-emitting layer 110 over the lower electrode (the transparent conductive film 106), the partition 108, and the second light-emitting layer 112 (see FIG. 13C).

The first light-emitting layer 110 includes the first light-emitting material having a spectrum peak in the range of higher than or equal to 540 nm and lower than or equal to 580 nm. As the first light-emitting material, a phosphorescent organic compound emitting yellow light can be used. The phosphorescent organic compound may be vapor-deposited alone or the phosphorescent organic compound mixed with another material may be vapor-deposited. For example, the phosphorescent organic compound may be used as a guest material, and the guest material may be dispersed into a host material having a higher excitation energy than the guest material.

<Fourth Step>

Figure 13D:
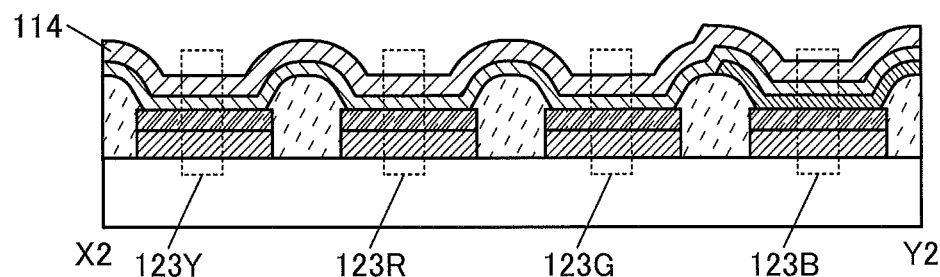

The fourth step is a step for forming the second electrode 114 having a function of the upper electrode of the light-emitting element over the first light-emitting layer 110 (see FIG. 13D).

Note that before the second electrode 114 is formed, an organic compound (e.g., an electron-transport layer and/or an electron-injection layer) shared among the first light-emitting element 123R, the second light-emitting element 123G, the third light-emitting element 123B, and the fourth light-emitting element 123Y may be formed over the first light-emitting layer 110.

Through the above-described steps, the first light-emitting element 123R, the second light-emitting element 123G, the third light-emitting element 123B, and the fourth light-emitting element 123Y are formed over the substrate 102.

<Fifth Step and Sixth Step>

These fifth and sixth steps are not described here because they are similar to the above-described fifth and sixth steps of the light-emitting device 140.

Through the above-described steps, the light-emitting device 170 illustrated in FIG. 7A can be formed. In this embodiment, in manufacturing the light-emitting elements, the number of steps for forming a layer on selected pixels can be only one (the step for depositing the second light-emitting layer 112); thus, a manufacturing method of a light-emitting device with high productivity can be provided. Consequently, a manufacturing method of a novel light-emitting device in which a decrease in aperture ratio accompanied by fabrication of a high-definition device is suppressed can be provided. Furthermore, a novel light-emitting device which can be produced easily can be provided.

This embodiment can be combined as appropriate with any of the other embodiments.

Embodiment 2

In this embodiment, structures of a light-emitting element included in the light-emitting device of one embodiment of the present invention will be described below with reference to FIG. 14 and FIGS. 15A to 15D.

The light-emitting element described as an example in this embodiment includes a lower electrode, a layer containing an organic compound (hereinafter referred to as an EL layer) over the lower electrode, and an upper electrode over the EL layer. One of the lower and upper electrodes functions as an anode, and the other functions as a cathode.

The EL layer is provided between the lower electrode and the upper electrode, and the structure of the EL layer is appropriately determined in accordance with polarities and materials of the lower electrode and the upper electrode.

Examples of the structure of the light-emitting element will be described below; however, the structure of the light-emitting element is not limited to the following examples.

<Structural Example of Light-Emitting Element>

Figure 14:
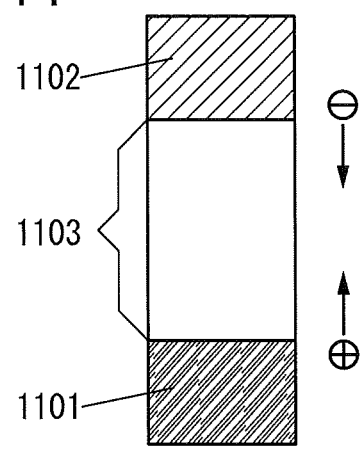
FIG. 14 is a cross-sectional view illustrating an element structure of a light-emitting element.

An example of the structure of the light-emitting element is illustrated in FIG. 14. In the light-emitting element illustrated in FIG. 14, a light-emitting unit 1103 is provided between an anode 1101 and a cathode 1102.

The light-emitting unit 1103 includes at least one region where electrons and holes are recombined. The light-emitting unit 1103 includes at least one light-emitting layer containing a light-emitting substance, and may have a structure in which the light-emitting layer and a layer other than the light-emitting layer are stacked. Examples of the layer other than the light-emitting layer are layers containing a substance having a high hole-injection property, a substance having a high hole-transport property, a substance having a poor hole-transport property (substance which blocks holes), a substance having a high electron-transport property, a substance having a high electron-injection property, and a substance having a bipolar property (substance having high electron- and hole-transport properties).

When a voltage higher than the threshold voltage of the light-emitting element is applied between the anode 1101 and the cathode 1102, holes are injected to the light-emitting unit 1103 from the anode 1101 side and electrons are injected to the light-emitting unit 1103 from the cathode 1102 side. The injected electrons and holes are recombined in the light-emitting unit 1103 and the light-emitting substance contained in the light-emitting unit 1103 emits light.

<Structure Example 1 of Light-emitting Unit>

Figure 15A:
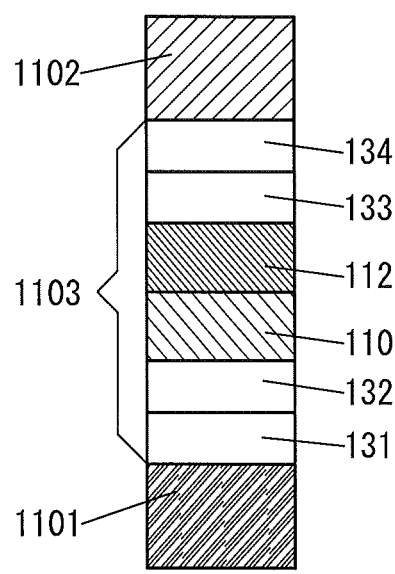
FIGS. 15A to 15D are cross-sectional views each illustrating an element structure of a light-emitting element.

An example of the structure of the light-emitting unit 1103 is illustrated in FIG. 15A. In the light-emitting unit 1103 illustrated in FIG. 15A, the hole-injection layer 131, the hole-transport layer 132, the first light-emitting layer 110, the second light-emitting layer 112, the electron-transport layer 133, and the electron-injection layer 134 are stacked in this order from the anode 1101 side.

Note that the light-emitting unit 1103 illustrated in FIG. 15A corresponds to the structure of the first light-emitting element 122R, the second light-emitting element 122G, and the fourth light-emitting element 122Y illustrated in FIG. 4B.

The holes injected from the anode 1101 side and the electrons injected from the cathode 1102 side are recombined in and around the first light-emitting layer 110, and the recombination energy makes the first light-emitting material included in the first light-emitting layer 110 emit light.

Note that the first light-emitting layer 110 preferably has a structure which does not transport the holes injected from the anode side to the second light-emitting layer 112. For example, a layer containing a material with a high electron-transport property and a low hole-transport property or a material having a deeper HOMO level than the second light-emitting layer 112 may be provided in the first light-emitting layer 110 so as to be in contact with the second light-emitting layer 112.

The first light-emitting layer 110 includes the first light-emitting material having a spectrum peak in the range of higher than or equal to 540 nm and lower than or equal to 580 nm. As the first light-emitting material, a phosphorescent substance having high emission efficiency is preferably used.

In the structure of the light-emitting unit 1103 illustrated in FIG. 15A, the second light-emitting layer 112 functions as not a light-emitting layer but an electron-transport layer. The second light-emitting layer 112 transports electrons injected from the cathode 1102 side to the first light-emitting layer 110.

<Structure Example 2 of Light-Emitting Unit>

Figure 15B:
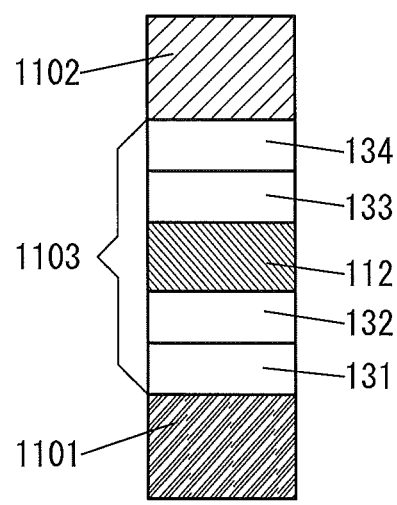

Another example of the structure of the light-emitting unit 1103 is illustrated in FIG. 15B. In the light-emitting unit 1103 illustrated in FIG. 15B, the hole-injection layer 131, the hole-transport layer 132, the second light-emitting layer 112, the electron-transport layer 133, and the electron-injection layer 134 are stacked in this order from the anode 1101 side.

The light-emitting unit 1103 illustrated in FIG. 15B corresponds to the structure of the third light-emitting element 122B illustrated in FIG. 4B.

The holes injected from the anode 1101 side and the electrons injected from the cathode 1102 side are recombined in the second light-emitting layer 112, and the recombination energy makes the second light-emitting material included in the second light-emitting layer 112 emit light.

The second light-emitting layer 112 includes the second light-emitting material having a spectrum peak in the range of higher than or equal to 420 nm and lower than or equal to 480 nm. As the second light-emitting material, a fluorescent substance is preferably used in terms of reliability. In the case of using a fluorescent substance in the second light-emitting layer 112, the fluorescent substance is preferably dispersed in an anthracene derivative. Having a high electron-transport property, the anthracene derivative used in the second light-emitting layer 112 can suppress light emission from the second light-emitting layer 112 in the light-emitting unit 1103 illustrated in FIG. 15A. At this time, the fluorescent substance is preferably an aromatic amine compound because an aromatic amine compound has a high hole trapping property (a property that makes holes difficult to move) and increases an electron-transport property of the second light-emitting layer 112. As the aromatic amine compound, a pyrene derivative is particularly preferable.

In the structure of the light-emitting unit 1103 illustrated in FIG. 15B, the second light-emitting layer 112 functions as a light-emitting layer.

<Structure Example 3 of Light-Emitting Unit>

Figure 15C:
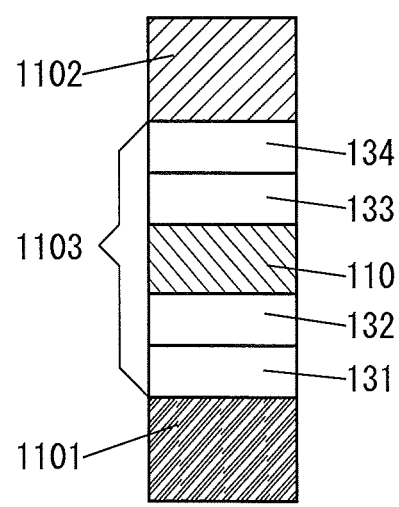

Another example of the structure of the light-emitting unit 1103 is illustrated in FIG. 15C. In the light-emitting unit 1103 illustrated in FIG. 15C, the hole-injection layer 131, the hole-transport layer 132, the first light-emitting layer 110, the electron-transport layer 133, and the electron-injection layer 134 are stacked in this order from the anode 1101 side.

Note that the light-emitting unit 1103 illustrated in FIG. 15C corresponds to the structure of the first light-emitting element 125R, the second light-emitting element 125G, and the fourth light-emitting element 125Y illustrated in FIG. 8A.

The holes injected from the anode 1101 side and the electrons injected from the cathode 1102 side are recombined in and around the first light-emitting layer 110, and the recombination energy makes the first light-emitting material included in the first light-emitting layer 110 emit light.

The first light-emitting layer 110 includes the first light-emitting material having a spectrum peak in the range of higher than or equal to 540 nm and lower than or equal to 580 nm. As the first light-emitting material, a phosphorescent substance having high emission efficiency is preferably used.

<Structure Example 4 of Light-Emitting Unit>

Figure 15D:
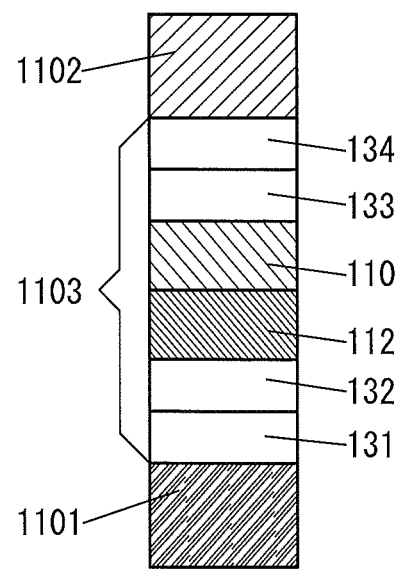

Another example of the structure of the light-emitting unit 1103 is illustrated in FIG. 15D. In the light-emitting unit 1103 illustrated in FIG. 15D, the hole-injection layer 131, the hole-transport layer 132, the second light-emitting layer 112, the first light-emitting layer 110, the electron-transport layer 133, and the electron-injection layer 134 are stacked in this order from the anode 1101 side.

The light-emitting unit 1103 illustrated in FIG. 15D corresponds to the structure of the third light-emitting element 125B illustrated in FIG. 8A.

The holes injected from the anode 1101 side and the electrons injected from the cathode 1102 side are recombined in the second light-emitting layer 112, and the recombination energy makes the second light-emitting material included in the second light-emitting layer 112 emit light.

Note that the second light-emitting layer 112 preferably has a structure which does not transport the holes injected from the anode side to the first light-emitting layer 110. For example, a layer containing a material with a high electron-transport property and a low hole-transport property or a material having a deeper HOMO level than the second light-emitting layer 112 may be provided in the second light-emitting layer 112 so as to be in contact with the first light-emitting layer 110.

The second light-emitting layer 112 includes the second light-emitting material having a spectrum peak in the range of higher than or equal to 420 nm and lower than or equal to 480 nm. As the second light-emitting material, a fluorescent substance is preferably used in terms of reliability.

In the structure of the light-emitting unit 1103 illustrated in FIG. 15D, the first light-emitting layer 110 functions as not a light-emitting layer but an electron-transport layer. The first light-emitting layer 110 transports electrons injected from the cathode 1102 side to the second light-emitting layer 112.

The EL layer, the upper electrode, and the lower electrode described in this embodiment can be formed by a variety of methods (e.g., a dry method and a wet method) in accordance with the materials of the EL layer, the upper electrode, and the lower electrode. For example, the EL layer, the upper electrode, and the lower electrode is formed by a method selected from a sputtering method, a vacuum evaporation method, a transfer method, a printing method (e.g., relief printing, intaglio printing, gravure printing, planography printing, and stencil printing), an ink jet method, a coating method, a spin coating method, and the like. Note that the EL layer, the upper electrode, and the lower electrode may be formed by methods different from each other.

This embodiment can be combined with any of the other embodiments in this specification as appropriate.

Embodiment 3

In this embodiment, as an example of a light-emitting device that is one embodiment of the present invention, an active matrix light-emitting device is described with reference to FIGS. 16A and 16B.

Figure 16A:
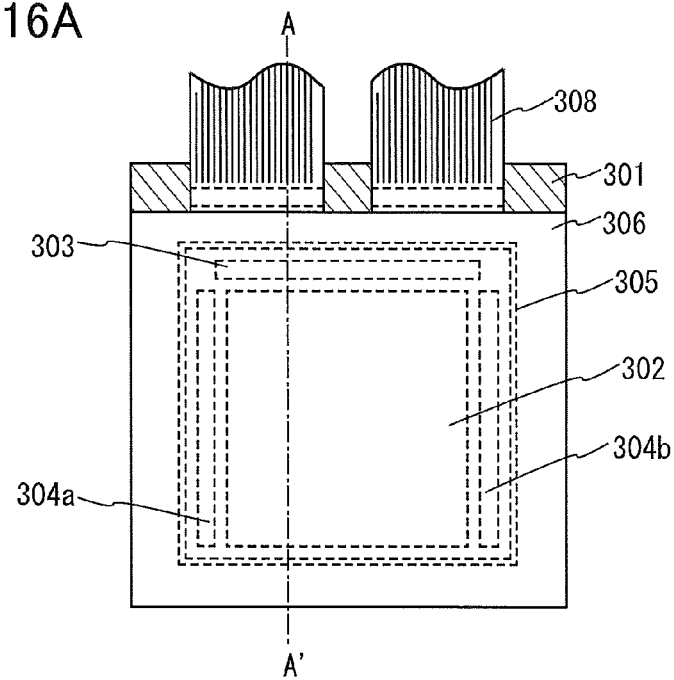
FIGS. 16A and 16B illustrate a light-emitting device.
Figure 16B:
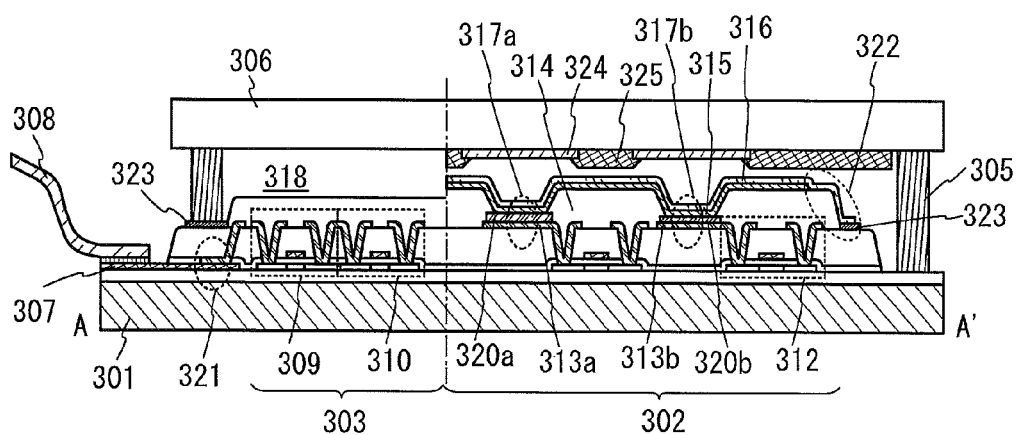

Note that FIG. 16A is a plan view illustrating a light-emitting device and FIG. 16B is a cross-sectional view taken along the dashed-dotted line A-A' in FIG. 16A. The active matrix light-emitting device according to this embodiment includes a pixel portion 302 provided over an element substrate 301, a driver circuit portion (a source line driver circuit) 303, and driver circuit portions (gate line driver circuits) 304 (304a and 304b). The pixel portion 302, the driver circuit portion 303, and the driver circuit portions 304 are sealed between the element substrate 301 and a sealing substrate 306 with a sealant 305.

In addition, over the element substrate 301, a lead wiring 307 for connecting an external input terminal, through which a signal (e.g., a video signal, a clock signal, a start signal, a reset signal, or the like) or an electric potential is transmitted to the driver circuit portion 303 and the driver circuit portion 304, is provided. Here is shown an example in which a flexible printed circuit (FPC) 308 is provided as the external input terminal. Although only the FPC is shown here, the FPC may be provided with a printed wiring board (PWB). The light emitting device in this specification includes not only a main body of the light emitting device but also the light emitting device with an FPC or a PWB attached.

Next, a cross-sectional structure will be described with reference to FIG. 16B. The driver circuit portions and the pixel portion are formed over the element substrate 301; here are illustrated the driver circuit portion 303 which is the source line driver circuit and the pixel portion 302.

The driver circuit portion 303 is an example in which an FET 309 and an FET 310 are combined. Note that each of the FET 309 and the FET 310 included in the driver circuit portion 303 may be formed with a circuit including transistors having the same conductivity type (either an n-channel transistor or a p-channel transistor) or a CMOS circuit including an n-channel transistor and a p-channel transistor. Although a driver integrated type in which the driver circuit is formed over the substrate is described in this embodiment, the driver circuit may not necessarily be formed over the substrate, and the driver circuit can be formed outside, not over the substrate.

The pixel portion 302 includes a switching FET (not shown) and a current control FET 312, and a wiring of the current control FET 312 (a source electrode or a drain electrode) is electrically connected to first electrodes (anodes) (313a and 313b) of light-emitting elements 317a and 317b. Although the pixel portion 302 includes two FETs (the switching FET and the current control FET 312) in this embodiment, one embodiment of the present invention is not limited thereto. The pixel portion 302 may include, for example, three or more FETs and a capacitor in combination.

As the FETs 309, 310, and 312, for example, a staggered transistor or an inverted staggered transistor can be used. Examples of a semiconductor material that can be used for the FETs 309, 310, and 312 include Group 13 semiconductors (e.g., gallium), Group 14 semiconductors (e.g., silicon), compound semiconductors, oxide semiconductors, and organic semiconductors. In addition, there is no particular limitation on the crystallinity of the semiconductor material, and an amorphous semiconductor film or a crystalline semiconductor film can be used. In particular, an oxide semiconductor is preferably used for the FETs 309, 310, and 312. Examples of the oxide semiconductor include an In-Ga oxide and an In—M—Zn oxide (M is Al, Ga, Y, Zr, La, Ce, or Nd). For example, an oxide semiconductor material that has an energy gap of 2 eV or more, preferably 2.5 eV or more, further preferably 3 eV or more is used for the FETs 309, 310, and 312, so that the off-state current of the transistors can be reduced.

In addition, a conductive film 320 for optical adjustment may be stacked over the first electrode 313. For example, as illustrated in FIG. 16B, the wavelengths of light extracted from the light-emitting elements 317a and 317b are different from each other; thus, conductive films 320a and 320b are formed so that the thicknesses thereof are different from each other. A partition 314 formed of an insulating material is formed so as to cover edge portions of the first electrodes (313a and 313b). In this embodiment, the partition 314 is formed using a positive photosensitive acrylic resin. In this embodiment, the first electrodes (313a and 313b) are used as anodes.

The partition 314 preferably has a curved surface with curvature at an upper end portion or a lower end portion thereof This enables the favorable coverage of a film to be formed over the partition 314. The partition 314 can be formed using, for example, either a negative photosensitive resin or a positive photosensitive resin. The material of the partition 314 is not limited to an organic compound and an inorganic compound such as silicon oxide, silicon oxynitride, or silicon nitride can also be used.

An EL layer 315 and a second electrode 316 are stacked over the first electrodes (313a and 313b). In the EL layer 315, at least a light-emitting layer is provided. An edge portion of the EL layer 315 that is shared by the light-emitting elements (317a and 317b) including the first electrodes (313a and 313b), the EL layer 315, and the second electrode 316 is covered with the second electrode 316. The structure of the EL layer 315 is similar to any of the structures described in Embodiment 2.

For the first electrode 313, the EL layer 315, and the second electrode 316, any of the materials listed in Embodiment 1 can be used. The first electrodes (313a and 313b) of the light-emitting elements (317a and 317b) are electrically connected to a lead wiring 307 in a region 321, and an external signal is input to the first electrodes (313a and 313b) of the light-emitting elements (317a and 317b) through an FPC 308. Further, the second electrode 316 in the light-emitting elements (317a and 317b) is electrically connected to a lead wiring 323 in a region 322, and an external signal is input through the FPC 308 although it is not shown.

Although the cross-sectional view of FIG. 16B illustrates only two light-emitting elements 317, a plurality of light-emitting elements are arranged in a matrix in the pixel portion 302 as described in Embodiment 1. Light-emitting elements that provide light of four kinds of colors (R, G, B, and Y) are formed in the pixel portion 302, whereby a light-emitting device capable of full color display can be obtained.

Furthermore, the sealing substrate 306 is attached to the element substrate 301 with a sealant 305, whereby a light-emitting element 317 is provided in a space 318 surrounded by the element substrate 301, the sealing substrate 306, and the sealant 305.

An optical element 324 is provided for the sealing substrate 306, and a light-blocking layer 325 is provided between adjacent optical elements. Note that light emission obtained from the light-emitting elements 317a and 317b is extracted to the outside through the optical element 324.

Note that the space 318 may be filled with an inert gas (such as nitrogen or argon) or a solid such as the sealant 305.

An epoxy-based resin or glass frit is preferably used for the sealant 305. The material preferably allows as little moisture and oxygen as possible to penetrate. As the sealing substrate 306, a glass substrate, a quartz substrate, or a plastic substrate formed of fiber reinforced plastic (FRP), poly(vinyl fluoride) (PVF), polyester, acrylic, or the like can be used. In the case where glass frit is used as the sealant, the element substrate 301 and the sealing substrate 306 are preferably glass substrates for high adhesion.

As described above, an active matrix light-emitting device can be obtained.

Note that a passive matrix light-emitting device using a light-emitting element with the element structure described in Embodiment 1 can be manufactured as a light-emitting device.

Note that the structure described in this embodiment can be combined as appropriate with any of the structures described in the other embodiments.

Embodiment 4

In this embodiment, examples of a variety of electronic devices that are completed using a light-emitting device according to one embodiment of the present invention will be described with reference to FIGS. 17A, 17B, 17C, 17D, 17D'-1, and 17D'-2.

Examples of electronic devices to which the light-emitting device is applied are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like.

FIG. 17A illustrates an example of a television device. In a television device 7100, a display portion 7103 is incorporated in a housing 7101. Images can be displayed by the display portion 7103, and the light-emitting device can be used for the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasting can be received. Moreover, when the television device is connected to a communication network with or without wires via the modem, one-way (from a sender to a receiver) or two-way (between a sender and a receiver or between receivers) information communication can be performed.

FIG. 17B illustrates a computer, which includes a main body 7201, a housing 7202, a display portion 7203, a keyboard 7204, an external connection port 7205, a pointing device 7206, and the like. Note that this computer can be manufactured using the light-emitting device for the display portion 7203.

FIG. 17C illustrates a watch-type information terminal. The watch-type information terminal includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 can display an icon 7305 indicating time, another icon 7306, and the like.

The watch-type information terminal in FIG. 17C can have a variety of functions, for example, a function of displaying a variety of information (e.g., a still image, a moving image, and a text image) on a display portion, a touch sensor function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading program or data stored in a recording medium and displaying the program or data on a display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the watch-type information terminal can be manufactured using the light-emitting device for the display panel 7304.

FIG. 17D illustrates an example of a mobile phone (e.g., smartphone). A mobile phone 7400 includes a housing 7401 provided with a display portion 7402, a microphone 7406, a speaker 7405, a camera 7407, an external connection portion 7404, an operation button 7403, and the like. In the case where a light-emitting device is manufactured by forming a light-emitting element of one embodiment of the present invention over a flexible substrate, the light-emitting element can be used for the display portion 7402 having a curved surface as illustrated in FIG. 17D.

When the display portion 7402 of the cellular phone 7400 illustrated in FIG. 17D is touched with a finger or the like, data can be input to the cellular phone 7400. Further, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device including a sensor (e.g., a gyroscope or an acceleration sensor) is provided inside the mobile phone 7400, display on the screen of the display portion 7402 can be automatically changed by determining the orientation of the mobile phone 7400 (whether the mobile phone is placed horizontally or vertically).

The screen modes are changed by touch on the display portion 7402 or operation with the operation button 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, when a backlight or a sensing light source which emits near-infrared light is provided in the display portion, an image of a finger vein, a palm vein, or the like can be taken.

Furthermore, the light-emitting device can be used for a mobile phone having a structure illustrated in FIG. 17D'1 or FIG. 17D'2, which is another structure of the mobile phone (e.g., smartphone).

Note that in the case of the structure illustrated in FIG. 17D'1 or FIG. 17D'2, text data, image data, or the like can be displayed on second screens 7502(1) and 7502(2) of housings 7500(1) and 7500(2) as well as first screens 7501(1) and 7501(2). Such a structure enables a user to easily see text data, image data, or the like displayed on the second screens 7502(1) and 7502(2) while the mobile phone is placed in user's breast pocket.

[0256]

Figure 18A:
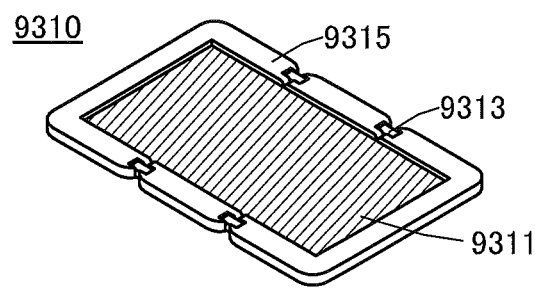
FIGS. 18A to 18C illustrate an electronic device.
Figure 18B:
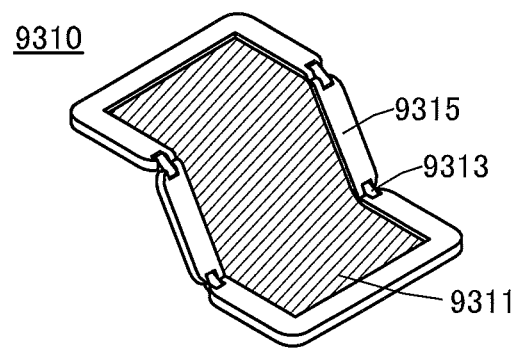
Figure 18C:
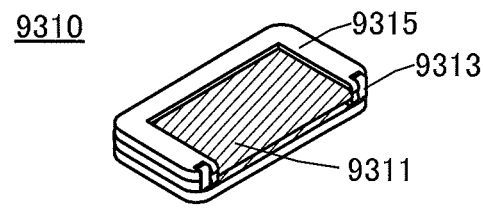

FIGS. 18A to 18C illustrate a foldable portable information terminal 9310. FIG. 18A illustrates the portable information terminal 9310 that is opened. FIG. 18B illustrates the portable information terminal 9310 that is being opened or being folded. FIG. 18C illustrates the portable information terminal 9310 that is folded. The portable information terminal 9310 is highly portable when folded. When the portable information terminal 9310 is opened, a seamless large display region is highly browsable.

A display panel 9311 is supported by three housings 9315 joined together by hinges 9313. By folding the portable information terminal 9310 at a connection portion between two housings 9315 with the hinges 9313, the portable information terminal 9310 can be reversibly changed in shape from an opened state to a folded state. A light-emitting device of one embodiment of the present invention can be used for the display panel 9311.

As described above, the electronic devices can be obtained by application of the light-emitting device according to one embodiment of the present invention. Note that the light-emitting device can be used for electronic devices in a variety of fields without being limited to the electronic devices described in this embodiment.

Note that the structure described in this embodiment can be combined as appropriate with any of the structures described in the other embodiments.

Embodiment 5

In this embodiment, examples of a lighting device to which a light-emitting device according to one embodiment of the present invention is applied will be described with reference to FIG. 19.

Figure 19:
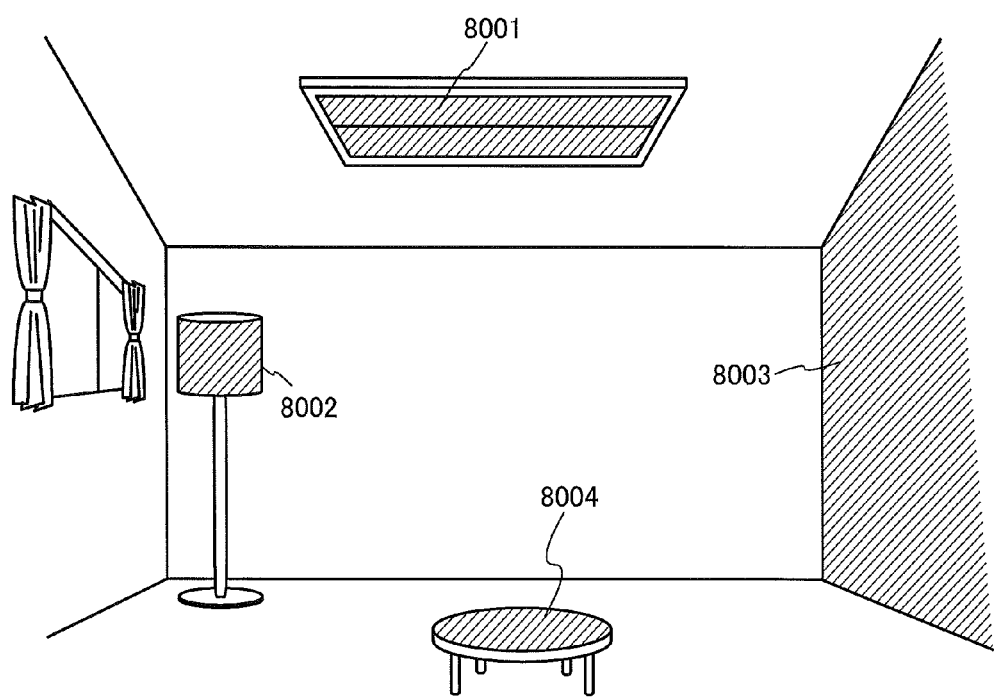
FIG. 19 illustrates lighting devices.

FIG. 19 illustrates an example in which a light-emitting device is used for an interior lighting device 8001. Note that since the area of the light-emitting device can be increased, a lighting device having a large area can also be formed. In addition, a lighting device 8002 in which a light-emitting region has a curved surface can also be obtained with the use of a housing with a curved surface. A light-emitting element included in the light-emitting device described in this embodiment is in a thin film form, which allows the housing to be designed more freely. Therefore, the lighting device can be elaborately designed in a variety of ways. Further, a wall of the room may be provided with a large-sized lighting device 8003. A touch sensor may be provided in the lighting devices 8001, 8002, and 8003 to control the power on/off of the light-emitting device.

Moreover, when the light-emitting device is used for a table by being used as a surface of a table, a lighting device 8004 which has a function as a table can be obtained. When the light-emitting device is used as part of other furniture, a lighting device which has a function as the furniture can be obtained.

In this manner, a variety of lighting devices to which the light-emitting device is applied can be obtained. Note that such lighting devices are also embodiments of the present invention.

Note that the structure described in this embodiment can be combined as appropriate with any of the structures described in the other embodiments.

This application is based on Japanese Patent Application serial no. 2014-091459 filed with Japan Patent Office on Apr. 25, 2014, the entire contents of which are hereby incorporated by reference.

What is claimed is:

1. A light-emitting device comprising:
a first pixel comprising a first light-emitting element and a first optical element overlapping with the first light-emitting element,
a second pixel comprising a second light-emitting element and a second optical element overlapping with the second light-emitting element, and
a third pixel comprising a third light-emitting element,
wherein a first light of a first color is emitted from the first pixel,
wherein a second light of a second color is emitted from the second pixel,
wherein a third light of a third color is emitted from the third pixel,
wherein the first light-emitting element comprises:
a first electrode;
a first light-emitting layer over the first electrode;
a second light-emitting layer over the first light-emitting layer; and
a second electrode over the second light-emitting layer,
wherein the second light-emitting element comprises:
a third electrode;
the first light-emitting layer over the third electrode;
the second light-emitting layer over the first light-emitting layer; and
the second electrode over the second light-emitting layer,
wherein the third light-emitting element comprises:
a fourth electrode;
the second light-emitting layer over the fourth electrode; and
the second electrode over the second light-emitting layer,
wherein the first light-emitting layer comprises a first light-emitting material having a spectrum peak in a range of higher than or equal to 540 nm and lower than or equal to 580 nm, and
wherein the second light-emitting layer comprises a second light-emitting material having a spectrum peak in a range of higher than or equal to 420 nm and lower than or equal to 480 nm.

2. The light-emitting device according to claim 1, further comprising:
a first transparent conductive film between the first electrode and the first light-emitting layer;
a second transparent conductive film between the third electrode and the first light-emitting layer; and
a third transparent conductive film between the fourth electrode and the second light-emitting layer.

3. The light-emitting device according to claim 2,
wherein the first transparent conductive film has a first thickness,
wherein the second transparent conductive film has a second thickness,
wherein the third transparent conductive film has a third thickness,
wherein the first thickness is larger than the second thickness, and
wherein the second thickness is larger than the third thickness.

4. An electronic device comprising:
the light-emitting device according to claim 1; and
a touch sensor function.

5. A lighting device comprising:
the light-emitting device according to claim 1; and
a touch sensor function.

6. A light-emitting device comprising:
a first pixel comprising a first light-emitting element and a first optical element overlapping with the first light-emitting element,
a second pixel comprising a second light-emitting element and a second optical element overlapping with the second light-emitting element, and
a third pixel comprising a third light-emitting element,
wherein a first light of a first color is emitted from the first pixel,
wherein a second light of a second color is emitted from the second pixel,
wherein a third light of a third color is emitted from the third pixel,
wherein the first light-emitting element comprises:
a first electrode;
a first light-emitting layer over the first electrode; and
a second electrode over the first light-emitting layer,
wherein the second light-emitting element comprises:
a third electrode;
the first light-emitting layer over the third electrode; and
a second electrode over the first light-emitting layer,
wherein the third light-emitting element comprises:
a fourth electrode;
a second light-emitting layer over the fourth electrode;
the first light-emitting layer over the second light-emitting layer; and
the second electrode over the first light-emitting layer,
wherein the first light-emitting layer comprises a first light-emitting material having a spectrum peak in a range of higher than or equal to 540 nm and lower than or equal to 580 nm, and
wherein the second light-emitting layer comprises a second light-emitting material having a spectrum peak in a range of higher than or equal to 420 nm and lower than or equal to 480 nm.

7. The light-emitting device according to claim 6, further comprising:
a first transparent conductive film between the first electrode and the first light-emitting layer;
a second transparent conductive film between the third electrode and the first light-emitting layer; and
a third transparent conductive film between the fourth electrode and the second light-emitting layer.

8. The light-emitting device according to claim 7,
wherein the first transparent conductive film has a first thickness,
wherein the second transparent conductive film has a second thickness,
wherein the third transparent conductive film has a third thickness,
wherein the first thickness is larger than the second thickness, and
wherein the second thickness is larger than the third thickness.

9. An electronic device comprising:
the light-emitting device according to claim 6; and
a touch sensor function.

10. A lighting device comprising:
the light-emitting device according to claim 6; and
a touch sensor function.

11. A light-emitting device comprising:
a first pixel comprising a first light-emitting element and a first optical element overlapping with the first light-emitting element,
a second pixel comprising a second light-emitting element and a second optical element overlapping with the second light-emitting element,
a third pixel comprising a third light-emitting element, and
a fourth pixel comprising a fourth light-emitting element,
wherein a first light of a first color is emitted from the first pixel,
wherein a second light of a second color is emitted from the second pixel,
wherein a third light of a third color is emitted from the third pixel,
wherein a fourth light of a fourth color is emitted from the fourth pixel,
wherein the first light-emitting element comprises:
  a first electrode;
  a first light-emitting layer over the first electrode;
  a second light-emitting layer over the first light-emitting layer; and
  a second electrode over the second light-emitting layer,
wherein the second light-emitting element comprises:
  a third electrode;
  the first light-emitting layer over the third electrode;
  the second light-emitting layer over the first light-emitting layer; and
  the second electrode over the second light-emitting layer,
wherein the third light-emitting element comprises:
  a fourth electrode;
  the second light-emitting layer over the fourth electrode; and
  the second electrode over the second light-emitting layer,
wherein the fourth light-emitting element comprises:
  a fifth electrode;
  the first light-emitting layer over the fifth electrode;
  the second light-emitting layer over the first light-emitting layer; and
  the second electrode over the second light-emitting layer,
wherein the first light-emitting layer comprises a first light-emitting material having a spectrum peak in a range of higher than or equal to 540 nm and lower than or equal to 580 nm, and
wherein the second light-emitting layer comprises a second light-emitting material having a spectrum peak in a range of higher than or equal to 420 nm and lower than or equal to 480 nm.

12. The light-emitting device according to claim 11, further comprising:
a first transparent conductive film between the first electrode and the first light-emitting layer;
a second transparent conductive film between the third electrode and the first light-emitting layer;
a third transparent conductive film between the fourth electrode and the second light-emitting layer; and
a fourth transparent conductive film between the fifth electrode and the first light-emitting layer.

13. The light-emitting device according to claim 12,
wherein the first transparent conductive film has a first thickness,
wherein the second transparent conductive film has a second thickness,
wherein the third transparent conductive film has a third thickness,
wherein the fourth transparent conductive film has a fourth thickness,
wherein the first thickness is larger than the fourth thickness,
wherein the fourth thickness is larger than the second thickness, and
wherein the second thickness is larger than the third thickness.

14. An electronic device comprising:
the light-emitting device according to claim 11; and
a touch sensor function.

15. A lighting device comprising:
the light-emitting device according to claim 11; and
a touch sensor function.

16. A light-emitting device comprising:
a first pixel comprising a first light-emitting element and a first optical element overlapping with the first light-emitting element,
a second pixel comprising a second light-emitting element and a second optical element overlapping with the second light-emitting element,
a third pixel comprising a third light-emitting element, and
a fourth pixel comprising a fourth light-emitting element,
wherein a first light of a first color is emitted from the first pixel,
wherein a second light of a second color is emitted from the second pixel,
wherein a third light of a third color is emitted from the third pixel,
wherein a fourth light of a fourth color is emitted from the fourth pixel,
wherein the first light-emitting element comprises:
  a first electrode;
  a first light-emitting layer over the first electrode; and
  a second electrode over the first light-emitting layer,
wherein the second light-emitting element comprises:
  a third electrode;
  the first light-emitting layer over the third electrode; and
  the second electrode over the first light-emitting layer,
wherein the third light-emitting element comprises:
  a fourth electrode;
  a second light-emitting layer over the fourth electrode;
  the first light-emitting layer over the second light-emitting layer; and
  the second electrode over the first light-emitting layer,
wherein the fourth light-emitting element comprises:
  a fifth electrode;
  the first light-emitting layer over the fifth electrode; and
  the second electrode over the first light-emitting layer,
wherein the first light-emitting layer comprises a first light-emitting material having a spectrum peak in a range of higher than or equal to 540 nm and lower than or equal to 580 nm, and
wherein the second light-emitting layer comprises a second light-emitting material having a spectrum peak in a range of higher than or equal to 420 nm and lower than or equal to 480 nm.

17. The light-emitting device according to claim 16, further comprising:

a first transparent conductive film between the first electrode and the first light-emitting layer;
a second transparent conductive film between the third electrode and the first light-emitting layer;
a third transparent conductive film between the fourth electrode and the second light-emitting layer; and
a fourth transparent conductive film between the fifth electrode and the first light-emitting layer.

18. The light-emitting device according to claim 17,
wherein the first transparent conductive film has a first thickness,
wherein the second transparent conductive film has a second thickness,
wherein the third transparent conductive film has a third thickness,
wherein the fourth transparent conductive film has a fourth thickness,
wherein the first thickness is larger than the fourth thickness,
wherein the fourth thickness is larger than the second thickness, and
wherein the second thickness is larger than the third thickness.

19. An electronic device comprising:
the light-emitting device according to claim 16; and
a touch sensor function.

20. A lighting device comprising:
the light-emitting device according to claim 16; and
a touch sensor function.

* * * * *

UNITED STATES PATENT AND TRADEMARK OFFICE
CERTIFICATE OF CORRECTION

| | | |
|---|---|---|
| PATENT NO. | : 9,450,032 B2 | Page 1 of 1 |
| APPLICATION NO. | : 14/694165 | |
| DATED | : September 20, 2016 | |
| INVENTOR(S) | : Satoshi Seo and Nobuharu Ohsawa | |

It is certified that error appears in the above-identified patent and that said Letters Patent is hereby corrected as shown below:

In the Specification

Column 2, Line 51; Change "480 nm More" to --480 nm. More--.
Column 7, Line 40; Change "includes .a" to --includes a--.
Column 9, Line 56; Change "$1\times10^{-2}\ ^{\Omega}cm$" to --$1\times10^{-2}\ \Omega cm$--.
Column 10, Line 14; Change "(in" to --(m--.
Column 10, Line 38; Change "$1\times10^{-2}\ ^{\Omega}cm$" to --$1\times10^{-2}\ \Omega cm$--.
Column 11, Line 30; Change "N,N-" to --N,N'- --.
Column 12, Line 10; Change "(abbreviation      Ir" to --(abbreviation: Ir--.
Column 12, Line 28; Change "2[3" to --2-[3--.
Column 12, Line 33; Change "7[3" to --7-[3--.
Column 12, Line 34; Change "yflphenyl]dibenzo" to --yl)phenyl]dibenzo--.
Column 12, Line 36; Change "dibenzo   quinoxaline" to --dibenzo[f,h]quinoxaline--.
Column 14, Line 13; Change "121 G" to --121G--.
Column 14, Line 42; Change "1068, the" to --106R, the--.
Column 14, Line 49; Change "1068, the" to --106R, the--.
Column 14, Line 52; Change "(in" to --(m--.
Column 15, Line 30; Change "1068, the" to --106R, the--.
Column 16, Line 52; Change "N,N" to --N,N'--.
Column 17, Line 47; Change "BAlq," to --BAlq,--.
Column 19, Lines 47 to 48; Change "consumption. 10." to --consumption.--.
Column 21, Line 42; Change "where X is" to --where λ is--.
Column 24, Line 9; Change "101 G" to --101G--.
Column 29, Line 59; Change "framed" to --formed--.
Column 36, Line 67; Change "thereof This" to --thereof. This--.
Column 40, Line 6; Delete "[0256]".

Signed and Sealed this
Twenty-first Day of March, 2017

Michelle K. Lee
*Director of the United States Patent and Trademark Office*